(12) United States Patent
Osborn et al.

(10) Patent No.: US 10,860,914 B1
(45) Date of Patent: Dec. 8, 2020

(54) CONTACTLESS CARD AND METHOD OF ASSEMBLY

(71) Applicant: Capital One Services, LLC, McLean, VA (US)

(72) Inventors: Kevin Osborn, Newton, MA (US); David Wurmfeld, Falls Church, VA (US)

(73) Assignee: Capital One Services, LLC, McLean, VA (US)

( * ) Notice: Subject to any disclaimer, the term of this patent is extended or adjusted under 35 U.S.C. 154(b) by 0 days.

(21) Appl. No.: 16/731,337

(22) Filed: Dec. 31, 2019

(51) Int. Cl.
G06K 19/077 (2006.01)

(52) U.S. Cl.
CPC .. *G06K 19/07749* (2013.01); *G06K 19/07722* (2013.01); *G06K 19/07747* (2013.01); *H01L 2224/48091* (2013.01); *H01L 2224/48151* (2013.01)

(58) Field of Classification Search
CPC ................ G06K 19/07773; G06K 19/07749
See application file for complete search history.

(56) References Cited

U.S. PATENT DOCUMENTS

| | | | |
|---|---|---|---|
| 4,683,553 A | 7/1987 | Mollier | |
| 4,827,113 A | 5/1989 | Rikuna | |
| 4,910,773 A | 3/1990 | Hazard et al. | |
| 5,036,461 A | 7/1991 | Elliott et al. | |
| 5,363,448 A | 11/1994 | Koopman, Jr. et al. | |
| 5,377,270 A | 12/1994 | Koopman, Jr. et al. | |
| 5,533,126 A | 7/1996 | Hazard | |
| 5,537,314 A | 7/1996 | Kanter | |
| 5,592,553 A | 1/1997 | Guski et al. | |
| 5,616,901 A | 4/1997 | Crandall | |
| 5,666,415 A | 9/1997 | Kaufman | |
| 5,763,373 A | 6/1998 | Robinson et al. | |
| 5,764,789 A | 6/1998 | Pare, Jr. et al. | |
| 5,768,373 A | 6/1998 | Lohstroh et al. | |

(Continued)

FOREIGN PATENT DOCUMENTS

| | | |
|---|---|---|
| CA | 3010336 A1 | 7/2017 |
| CN | 101192295 A | 6/2008 |

(Continued)

OTHER PUBLICATIONS

Batina, L. and Poll, E., "SmartCards and RFID", Course PowerPoint Presentation for IPA Security Course, Digital Security at University of Nijmegen, Netherlands (date unknown) 75 pages.

(Continued)

*Primary Examiner* — Omeed Alizada

(57) ABSTRACT

A method of forming a contactless transaction card. The method may include providing a card body, defining a window, and attaching an antenna assembly layer to the card body, where the antenna assembly layer includes an antenna, a set of curable connectors, disposed on a set of end regions of the antenna within the window, and a UV-transparent layer, supporting the antenna. The method may include providing a contactless chip module within the window on a first side of the antenna assembly layer, and directing radiation through the UV-transparent layer, wherein the contactless chip module is electrically connected to the antenna via the curable connectors.

20 Claims, 6 Drawing Sheets

(56) References Cited

U.S. PATENT DOCUMENTS

| | | |
|---|---|---|
| 5,778,072 A | 7/1998 | Samar |
| 5,796,827 A | 8/1998 | Coppersmith et al. |
| 5,832,090 A | 11/1998 | Raspotnik |
| 5,883,810 A | 3/1999 | Franklin et al. |
| 5,901,874 A | 5/1999 | Deters |
| 5,929,413 A | 7/1999 | Gardner |
| 5,960,411 A | 9/1999 | Hartman et al. |
| 6,021,203 A | 2/2000 | Douceur et al. |
| 6,049,328 A | 4/2000 | Vanderheiden |
| 6,058,373 A | 5/2000 | Blinn et al. |
| 6,061,666 A | 5/2000 | Do et al. |
| 6,105,013 A | 8/2000 | Curry et al. |
| 6,199,114 B1 | 3/2001 | White et al. |
| 6,199,762 B1 | 3/2001 | Hohle |
| 6,216,227 B1 | 4/2001 | Goldstein et al. |
| 6,227,447 B1 | 5/2001 | Campisano |
| 6,282,522 B1 | 8/2001 | Davis et al. |
| 6,324,271 B1 | 11/2001 | Sawyer et al. |
| 6,342,844 B1 | 1/2002 | Rozin |
| 6,367,011 B1 | 4/2002 | Lee et al. |
| 6,400,323 B2 | 6/2002 | Yasukawa et al. |
| 6,402,028 B1 | 6/2002 | Graham, Jr. et al. |
| 6,438,550 B1 | 8/2002 | Doyle et al. |
| 6,501,847 B2 | 12/2002 | Helot et al. |
| 6,631,197 B1 | 10/2003 | Taenzer |
| 6,641,050 B2 | 11/2003 | Kelley et al. |
| 6,655,585 B2 | 12/2003 | Shinn |
| 6,662,020 B1 | 12/2003 | Aaro et al. |
| 6,721,706 B1 | 4/2004 | Strubbe et al. |
| 6,731,778 B1 | 5/2004 | Oda et al. |
| 6,732,936 B1 | 5/2004 | Kiekhaefer |
| 6,779,115 B1 | 8/2004 | Naim |
| 6,792,533 B2 | 9/2004 | Jablon |
| 6,829,711 B1 | 12/2004 | Kwok et al. |
| 6,834,271 B1 | 12/2004 | Hodgson et al. |
| 6,834,795 B1 | 12/2004 | Rasmussen et al. |
| 6,852,031 B1 | 2/2005 | Rowe |
| 6,865,547 B1 | 3/2005 | Brake, Jr. et al. |
| 6,873,260 B2 | 3/2005 | Lancos et al. |
| 6,877,656 B1 | 4/2005 | Jaros et al. |
| 6,889,198 B2 | 5/2005 | Kawan |
| 6,905,411 B2 | 6/2005 | Nguyen et al. |
| 6,910,627 B1 | 6/2005 | Simpson-Young et al. |
| 6,971,031 B2 | 11/2005 | Haala |
| 6,990,588 B1 | 1/2006 | Yasukura |
| 7,006,986 B1 | 2/2006 | Sines et al. |
| 7,085,931 B1 | 8/2006 | Smith et al. |
| 7,127,605 B1 | 10/2006 | Montgomery et al. |
| 7,128,274 B2 | 10/2006 | Kelley et al. |
| 7,140,550 B2 | 11/2006 | Ramachandran |
| 7,152,045 B2 | 12/2006 | Hoffman |
| 7,165,727 B2 | 1/2007 | de Jong |
| 7,175,076 B1 | 2/2007 | Block et al. |
| 7,202,773 B1 | 4/2007 | Oba et al. |
| 7,206,806 B2 | 4/2007 | Pineau |
| 7,232,073 B1 | 6/2007 | de Jong |
| 7,246,752 B2 | 7/2007 | Brown |
| 7,254,569 B2 | 8/2007 | Goodman et al. |
| 7,263,507 B1 | 8/2007 | Brake, Jr. et al. |
| 7,270,276 B2 | 9/2007 | Vayssiere |
| 7,278,025 B2 | 10/2007 | Saito et al. |
| 7,287,692 B1 | 10/2007 | Patel et al. |
| 7,290,709 B2 | 11/2007 | Tsai et al. |
| 7,306,143 B2 | 12/2007 | Bonneau, Jr. et al. |
| 7,319,986 B2 | 1/2008 | Praisner et al. |
| 7,325,132 B2 | 1/2008 | Takayama et al. |
| 7,355,270 B2 | 4/2008 | Hasebe et al. |
| 7,373,515 B2 | 5/2008 | Owen et al. |
| 7,374,099 B2 | 5/2008 | de Jong |
| 7,375,616 B2 | 5/2008 | Rowse et al. |
| 7,380,710 B2 | 6/2008 | Brown |
| 7,424,977 B2 | 9/2008 | Smets et al. |
| 7,453,439 B1 | 11/2008 | Kushler et al. |
| 7,472,829 B2 | 1/2009 | Brown |
| 7,487,357 B2 | 2/2009 | Smith et al. |
| 7,568,631 B2 | 8/2009 | Gibbs et al. |
| 7,584,153 B2 | 9/2009 | Brown et al. |
| 7,597,250 B2 | 10/2009 | Finn |
| 7,628,322 B2 | 12/2009 | Holtmanns et al. |
| 7,652,578 B2 | 1/2010 | Braun et al. |
| 7,689,832 B2 | 3/2010 | Talmor et al. |
| 7,703,142 B1 | 4/2010 | Wilson et al. |
| 7,748,609 B2 | 7/2010 | Sachdeva et al. |
| 7,748,617 B2 | 7/2010 | Gray |
| 7,748,636 B2 | 7/2010 | Finn |
| 7,762,457 B2 | 7/2010 | Bonalle et al. |
| 7,789,302 B2 | 9/2010 | Tame |
| 7,793,851 B2 | 9/2010 | Mullen |
| 7,796,013 B2 | 9/2010 | Murakami et al. |
| 7,801,799 B1 | 9/2010 | Brake, Jr. et al. |
| 7,801,829 B2 | 9/2010 | Gray et al. |
| 7,805,755 B2 | 9/2010 | Brown et al. |
| 7,809,643 B2 | 10/2010 | Phillips et al. |
| 7,827,115 B2 | 11/2010 | Weller et al. |
| 7,828,214 B2 | 11/2010 | Narendra et al. |
| 7,848,746 B2 | 12/2010 | Juels |
| 7,882,553 B2 | 2/2011 | Tuliani |
| 7,900,048 B2 | 3/2011 | Andersson |
| 7,908,216 B1 | 3/2011 | Davis et al. |
| 7,922,082 B2 | 4/2011 | Muscato |
| 7,933,589 B1 | 4/2011 | Mamdani et al. |
| 7,949,559 B2 | 5/2011 | Freiberg |
| 7,954,716 B2 | 6/2011 | Narendra et al. |
| 7,954,723 B2 | 6/2011 | Charrat |
| 7,962,369 B2 | 6/2011 | Rosenberg |
| 7,993,197 B2 | 8/2011 | Kaminkow |
| 8,005,426 B2 | 8/2011 | Huomo et al. |
| 8,010,405 B1 | 8/2011 | Bortolin et al. |
| RE42,762 E | 9/2011 | Shin et al. |
| 8,041,954 B2 | 10/2011 | Plesman |
| 8,060,012 B2 | 11/2011 | Sklovsky et al. |
| 8,074,877 B2 | 12/2011 | Mullen et al. |
| 8,082,450 B2 | 12/2011 | Frey et al. |
| 8,095,113 B2 | 1/2012 | Kean et al. |
| 8,099,332 B2 | 1/2012 | Lemay et al. |
| 8,103,249 B2 | 1/2012 | Markison |
| 8,108,687 B2 | 1/2012 | Ellis et al. |
| 8,127,143 B2 | 2/2012 | Abdallah et al. |
| 8,135,648 B2 | 3/2012 | Oram et al. |
| 8,140,010 B2 | 3/2012 | Symons et al. |
| 8,141,136 B2 | 3/2012 | Lee et al. |
| 8,150,321 B2 | 4/2012 | Winter et al. |
| 8,150,767 B2 | 4/2012 | Wankmueller |
| 8,186,602 B2 | 5/2012 | Itay et al. |
| 8,196,131 B1 | 6/2012 | von Behren et al. |
| 8,215,563 B2 | 7/2012 | Levy et al. |
| 8,224,753 B2 | 7/2012 | Atef et al. |
| 8,232,879 B2 | 7/2012 | Davis |
| 8,233,841 B2 | 7/2012 | Griffin et al. |
| 8,245,292 B2 | 8/2012 | Buer |
| 8,249,654 B1 | 8/2012 | Zhu |
| 8,266,451 B2 | 9/2012 | Leydier et al. |
| 8,285,329 B1 | 10/2012 | Zhu |
| 8,302,872 B2 | 11/2012 | Mullen |
| 8,312,519 B1 | 11/2012 | Bailey et al. |
| 8,316,237 B1 | 11/2012 | Felsher et al. |
| 8,332,272 B2 | 12/2012 | Fisher |
| 8,365,988 B1 | 2/2013 | Medina, III et al. |
| 8,369,960 B2 | 2/2013 | Tran et al. |
| 8,371,501 B1 | 2/2013 | Hopkins |
| 8,381,307 B2 | 2/2013 | Cimino |
| 8,391,719 B2 | 3/2013 | Alameh et al. |
| 8,417,231 B2 | 4/2013 | Sanding et al. |
| 8,439,271 B2 | 5/2013 | Smets et al. |
| 8,475,367 B1 | 7/2013 | Yuen et al. |
| 8,489,112 B2 | 7/2013 | Roeding et al. |
| 8,511,542 B2 | 8/2013 | Pan |
| 8,559,872 B2 | 10/2013 | Butler |
| 8,566,916 B1 | 10/2013 | Bailey et al. |
| 8,567,670 B2 | 10/2013 | Stanfield et al. |
| 8,572,386 B2 | 10/2013 | Takekawa et al. |
| 8,577,810 B1 | 11/2013 | Dalit et al. |
| 8,583,454 B2 | 11/2013 | Beraja et al. |
| 8,589,335 B2 | 11/2013 | Smith et al. |

(56) References Cited

U.S. PATENT DOCUMENTS

| | | |
|---|---|---|
| 8,594,730 B2 | 11/2013 | Bona et al. |
| 8,615,468 B2 | 12/2013 | Varadarajan |
| 8,620,218 B2 | 12/2013 | Awad |
| 8,667,285 B2 | 3/2014 | Coulier et al. |
| 8,723,941 B1 | 5/2014 | Shirbabadi et al. |
| 8,726,405 B1 | 5/2014 | Bailey et al. |
| 8,740,073 B2 | 6/2014 | Vijayshankar et al. |
| 8,750,514 B2 | 6/2014 | Gallo et al. |
| 8,752,189 B2 | 6/2014 | de Jong |
| 8,794,509 B2 | 8/2014 | Bishop et al. |
| 8,799,668 B2 | 8/2014 | Cheng |
| 8,806,592 B2 | 8/2014 | Ganesan |
| 8,807,440 B1 | 8/2014 | von Behren et al. |
| 8,811,892 B2 | 8/2014 | Khan et al. |
| 8,814,039 B2 | 8/2014 | Bishop et al. |
| 8,814,052 B2 | 8/2014 | Bona et al. |
| 8,818,867 B2 | 8/2014 | Baldwin et al. |
| 8,850,538 B1 | 9/2014 | Vernon et al. |
| 8,861,733 B2 | 10/2014 | Benteo et al. |
| 8,880,027 B1 | 11/2014 | Darringer |
| 8,888,002 B2 | 11/2014 | Marshall Chesney et al. |
| 8,898,088 B2 | 11/2014 | Springer et al. |
| 8,934,837 B2 | 1/2015 | Zhu et al. |
| 8,977,569 B2 | 3/2015 | Rao |
| 8,994,498 B2 | 3/2015 | Agrafioti et al. |
| 9,004,365 B2 | 4/2015 | Bona et al. |
| 9,038,894 B2 | 5/2015 | Khalid |
| 9,042,814 B2 | 5/2015 | Royston et al. |
| 9,047,531 B2 | 6/2015 | Showering et al. |
| 9,069,976 B2 | 6/2015 | Toole et al. |
| 9,081,948 B2 | 7/2015 | Magne |
| 9,104,853 B2 | 8/2015 | Venkataramani et al. |
| 9,118,663 B1 | 8/2015 | Bailey et al. |
| 9,122,964 B2 | 9/2015 | Krawczewicz |
| 9,129,280 B2 | 9/2015 | Bona et al. |
| 9,152,832 B2 | 10/2015 | Royston et al. |
| 9,203,800 B2 | 12/2015 | Izu et al. |
| 9,209,867 B2 | 12/2015 | Royston |
| 9,251,330 B2 | 2/2016 | Boivie et al. |
| 9,251,518 B2 | 2/2016 | Levin et al. |
| 9,258,715 B2 | 2/2016 | Borghei |
| 9,270,337 B2 | 2/2016 | Zhu et al. |
| 9,306,626 B2 | 4/2016 | Hall et al. |
| 9,306,942 B1 | 4/2016 | Bailey et al. |
| 9,324,066 B2 | 4/2016 | Archer et al. |
| 9,324,067 B2 | 4/2016 | Van Os et al. |
| 9,332,587 B2 | 5/2016 | Salahshoor |
| 9,338,622 B2 | 5/2016 | Bjontegard |
| 9,373,141 B1 | 6/2016 | Shakkarwar |
| 9,379,841 B2 | 6/2016 | Fine et al. |
| 9,413,430 B2 | 8/2016 | Royston et al. |
| 9,413,768 B1 | 8/2016 | Gregg et al. |
| 9,420,496 B1 | 8/2016 | Indurkar |
| 9,426,132 B1 | 8/2016 | Alikhani |
| 9,432,339 B1 | 8/2016 | Bowness |
| 9,455,968 B1 | 9/2016 | Machani et al. |
| 9,473,509 B2 | 10/2016 | Arsanjani et al. |
| 9,491,626 B2 | 11/2016 | Sharma et al. |
| 9,553,637 B2 | 1/2017 | Yang et al. |
| 9,619,952 B1 | 4/2017 | Zhao et al. |
| 9,635,000 B1 | 4/2017 | Muftic |
| 9,665,858 B1 | 5/2017 | Kumar |
| 9,674,705 B2 | 6/2017 | Rose et al. |
| 9,679,286 B2 | 6/2017 | Colnot et al. |
| 9,680,942 B2 | 6/2017 | Dimmick |
| 9,710,804 B2 | 7/2017 | Zhou et al. |
| 9,740,342 B2 | 8/2017 | Paulsen et al. |
| 9,740,988 B1 | 8/2017 | Levin et al. |
| 9,763,097 B2 | 9/2017 | Robinson et al. |
| 9,767,329 B2 | 9/2017 | Forster |
| 9,769,662 B1 | 9/2017 | Queru |
| 9,773,151 B2 | 9/2017 | Mil'shtein et al. |
| 9,780,953 B2 | 10/2017 | Gaddam et al. |
| 9,891,823 B2 | 2/2018 | Feng et al. |
| 9,940,571 B1 | 4/2018 | Herrington |
| 9,953,323 B2 | 4/2018 | Candelore et al. |
| 9,961,194 B1 | 5/2018 | Wiechman et al. |
| 9,965,756 B2 | 5/2018 | Davis et al. |
| 9,965,911 B2 | 5/2018 | Wishne |
| 9,978,058 B2 | 5/2018 | Wurmfeld et al. |
| 10,043,164 B2 | 8/2018 | Dogin et al. |
| 10,075,437 B2 | 9/2018 | Costigan et al. |
| 10,129,648 B1 | 11/2018 | Hernandez et al. |
| 10,133,979 B1 | 11/2018 | Eidam et al. |
| 10,217,105 B1 | 2/2019 | Sangi et al. |
| 10,354,175 B1 * | 7/2019 | Vittimberga ..... G06K 19/07773 |
| 2001/0010723 A1 | 8/2001 | Pinkas |
| 2001/0029485 A1 | 10/2001 | Brody et al. |
| 2001/0034702 A1 | 10/2001 | Mockett et al. |
| 2001/0054003 A1 | 12/2001 | Chien et al. |
| 2002/0078345 A1 | 6/2002 | Sandhu et al. |
| 2002/0093530 A1 | 7/2002 | Krothapalli et al. |
| 2002/0100808 A1 | 8/2002 | Norwood et al. |
| 2002/0120583 A1 | 8/2002 | Keresman, III et al. |
| 2002/0152116 A1 | 10/2002 | Yan et al. |
| 2002/0153424 A1 | 10/2002 | Li |
| 2002/0165827 A1 | 11/2002 | Gien et al. |
| 2003/0023554 A1 | 1/2003 | Yap et al. |
| 2003/0034873 A1 | 2/2003 | Chase et al. |
| 2003/0055727 A1 | 3/2003 | Walker et al. |
| 2003/0078882 A1 | 4/2003 | Sukeda et al. |
| 2003/0167350 A1 | 9/2003 | Davis et al. |
| 2003/0208449 A1 | 11/2003 | Diao |
| 2004/0015958 A1 | 1/2004 | Veil et al. |
| 2004/0039919 A1 | 2/2004 | Takayama et al. |
| 2004/0127256 A1 | 7/2004 | Goldthwaite et al. |
| 2004/0215674 A1 | 10/2004 | Odinak et al. |
| 2004/0230799 A1 | 11/2004 | Davis |
| 2005/0044367 A1 | 2/2005 | Gasparini et al. |
| 2005/0075985 A1 | 4/2005 | Cartmell |
| 2005/0081038 A1 | 4/2005 | Arditti Modiano et al. |
| 2005/0138387 A1 | 6/2005 | Lam et al. |
| 2005/0156026 A1 | 7/2005 | Ghosh et al. |
| 2005/0160049 A1 | 7/2005 | Lundholm |
| 2005/0195975 A1 | 9/2005 | Kawakita |
| 2005/0247797 A1 | 11/2005 | Ramachandran |
| 2006/0006230 A1 | 1/2006 | Bear et al. |
| 2006/0040726 A1 | 2/2006 | Szrek et al. |
| 2006/0041402 A1 | 2/2006 | Baker |
| 2006/0044153 A1 | 3/2006 | Dawidowsky |
| 2006/0047954 A1 | 3/2006 | Sachdeva et al. |
| 2006/0085848 A1 | 4/2006 | Aissi et al. |
| 2006/0136334 A1 | 6/2006 | Atkinson et al. |
| 2006/0173985 A1 | 8/2006 | Moore |
| 2006/0174331 A1 | 8/2006 | Schuetz |
| 2006/0242698 A1 | 10/2006 | Inskeep et al. |
| 2006/0280338 A1 | 12/2006 | Rabb |
| 2007/0033642 A1 | 2/2007 | Ganesan et al. |
| 2007/0055630 A1 | 3/2007 | Gauthier et al. |
| 2007/0061266 A1 | 3/2007 | Moore et al. |
| 2007/0061487 A1 | 3/2007 | Moore et al. |
| 2007/0116292 A1 | 5/2007 | Kurita et al. |
| 2007/0118745 A1 | 5/2007 | Buer |
| 2007/0197261 A1 | 8/2007 | Humbel |
| 2007/0224969 A1 | 9/2007 | Rao |
| 2007/0241182 A1 | 10/2007 | Buer |
| 2007/0256134 A1 | 11/2007 | Lehtonen et al. |
| 2007/0258594 A1 | 11/2007 | Sandhu et al. |
| 2007/0278291 A1 | 12/2007 | Rans et al. |
| 2008/0008315 A1 | 1/2008 | Fontana et al. |
| 2008/0011831 A1 | 1/2008 | Bonalle et al. |
| 2008/0014867 A1 | 1/2008 | Finn |
| 2008/0035738 A1 | 2/2008 | Mullen |
| 2008/0071681 A1 | 3/2008 | Khalid |
| 2008/0072303 A1 | 3/2008 | Syed |
| 2008/0086767 A1 | 4/2008 | Kulkarni et al. |
| 2008/0103968 A1 | 5/2008 | Bies et al. |
| 2008/0109309 A1 | 5/2008 | Landau et al. |
| 2008/0110983 A1 | 5/2008 | Ashfield |
| 2008/0120711 A1 | 5/2008 | Dispensa |
| 2008/0156873 A1 | 7/2008 | Wilhelm et al. |
| 2008/0162312 A1 | 7/2008 | Sklovsky et al. |
| 2008/0164308 A1 | 7/2008 | Aaron et al. |
| 2008/0207307 A1 | 8/2008 | Cunningham, II et al. |

(56) References Cited

U.S. PATENT DOCUMENTS

| | | |
|---|---|---|
| 2008/0209543 A1 | 8/2008 | Aaron |
| 2008/0223918 A1 | 9/2008 | Williams et al. |
| 2008/0285746 A1 | 11/2008 | Landrock et al. |
| 2008/0308641 A1 | 12/2008 | Finn |
| 2009/0037275 A1 | 2/2009 | Pollio |
| 2009/0048026 A1 | 2/2009 | French |
| 2009/0132417 A1 | 5/2009 | Scipioni et al. |
| 2009/0143104 A1 | 6/2009 | Loh et al. |
| 2009/0171682 A1 | 7/2009 | Dixon et al. |
| 2009/0210308 A1 | 8/2009 | Toomer et al. |
| 2009/0213027 A1* | 8/2009 | Finn ................ G06K 19/07327 343/866 |
| 2009/0235339 A1 | 9/2009 | Mennes et al. |
| 2009/0249077 A1 | 10/2009 | Gargaro et al. |
| 2009/0282264 A1 | 11/2009 | Ameil et al. |
| 2010/0023449 A1 | 1/2010 | Skowronek et al. |
| 2010/0023455 A1 | 1/2010 | Dispensa et al. |
| 2010/0029202 A1 | 2/2010 | Jolivet et al. |
| 2010/0033310 A1 | 2/2010 | Narendra et al. |
| 2010/0036769 A1 | 2/2010 | Winters et al. |
| 2010/0078471 A1 | 4/2010 | Lin et al. |
| 2010/0082491 A1 | 4/2010 | Rosenblatt et al. |
| 2010/0094754 A1 | 4/2010 | Bertran et al. |
| 2010/0095130 A1 | 4/2010 | Bertran et al. |
| 2010/0100480 A1 | 4/2010 | Altman et al. |
| 2010/0114731 A1 | 5/2010 | Kingston et al. |
| 2010/0192230 A1 | 7/2010 | Steeves et al. |
| 2010/0207742 A1 | 8/2010 | Buhot et al. |
| 2010/0211797 A1 | 8/2010 | Westerveld et al. |
| 2010/0240413 A1 | 9/2010 | He et al. |
| 2010/0257357 A1 | 10/2010 | McClain |
| 2010/0312634 A1 | 12/2010 | Cervenka |
| 2010/0312635 A1 | 12/2010 | Cervenka |
| 2011/0028160 A1 | 2/2011 | Roeding et al. |
| 2011/0035604 A1 | 2/2011 | Habraken |
| 2011/0060631 A1 | 3/2011 | Grossman et al. |
| 2011/0068170 A1 | 3/2011 | Lehman |
| 2011/0084132 A1 | 4/2011 | Tofighbakhsh |
| 2011/0101093 A1 | 5/2011 | Ehrensvard |
| 2011/0113245 A1 | 5/2011 | Varadarajan |
| 2011/0125638 A1 | 5/2011 | Davis et al. |
| 2011/0131415 A1 | 6/2011 | Schneider |
| 2011/0153437 A1 | 6/2011 | Archer et al. |
| 2011/0153496 A1 | 6/2011 | Royyuru |
| 2011/0208658 A1 | 8/2011 | Makhotin |
| 2011/0208965 A1 | 8/2011 | Machani |
| 2011/0211219 A1 | 9/2011 | Bradley et al. |
| 2011/0218911 A1 | 9/2011 | Spodak |
| 2011/0238564 A1 | 9/2011 | Lim et al. |
| 2011/0246780 A1 | 10/2011 | Yeap et al. |
| 2011/0258452 A1 | 10/2011 | Coulier et al. |
| 2011/0280406 A1 | 11/2011 | Ma et al. |
| 2011/0282785 A1 | 11/2011 | Chin |
| 2011/0294418 A1 | 12/2011 | Chen |
| 2011/0312271 A1 | 12/2011 | Ma et al. |
| 2012/0024947 A1 | 2/2012 | Naelon |
| 2012/0030047 A1 | 2/2012 | Fuentes et al. |
| 2012/0030121 A1 | 2/2012 | Grellier |
| 2012/0047071 A1 | 2/2012 | Mullen et al. |
| 2012/0079281 A1 | 3/2012 | Lowenstein et al. |
| 2012/0109735 A1 | 5/2012 | Krawczewicz et al. |
| 2012/0109764 A1 | 5/2012 | Martin et al. |
| 2012/0143754 A1 | 6/2012 | Patel |
| 2012/0150737 A1 | 6/2012 | Rottink et al. |
| 2012/0178366 A1 | 7/2012 | Levy et al. |
| 2012/0196583 A1 | 8/2012 | Kindo |
| 2012/0207305 A1 | 8/2012 | Gallo et al. |
| 2012/0209773 A1 | 8/2012 | Ranganathan |
| 2012/0238206 A1 | 9/2012 | Singh et al. |
| 2012/0239560 A1 | 9/2012 | Pourfallah et al. |
| 2012/0252350 A1 | 10/2012 | Steinmetz et al. |
| 2012/0254394 A1 | 10/2012 | Barras |
| 2012/0284194 A1 | 11/2012 | Liu et al. |
| 2012/0290472 A1 | 11/2012 | Mullen et al. |
| 2012/0296818 A1 | 11/2012 | Nuzzi et al. |
| 2012/0316992 A1 | 12/2012 | Oborne |
| 2012/0317035 A1 | 12/2012 | Royyuru et al. |
| 2012/0317628 A1 | 12/2012 | Yeager |
| 2013/0005245 A1 | 1/2013 | Royston |
| 2013/0008956 A1 | 1/2013 | Ashfield |
| 2013/0026229 A1 | 1/2013 | Jarman et al. |
| 2013/0048713 A1 | 2/2013 | Pan |
| 2013/0054474 A1 | 2/2013 | Yeager |
| 2013/0065564 A1 | 3/2013 | Conner et al. |
| 2013/0080228 A1 | 3/2013 | Fisher |
| 2013/0080229 A1 | 3/2013 | Fisher |
| 2013/0099587 A1 | 4/2013 | Lou et al. |
| 2013/0104251 A1 | 4/2013 | Moore et al. |
| 2013/0106576 A1 | 5/2013 | Hinman et al. |
| 2013/0119130 A1 | 5/2013 | Braams |
| 2013/0130614 A1 | 5/2013 | Busch-Sorensen |
| 2013/0144793 A1 | 6/2013 | Royston |
| 2013/0171929 A1 | 7/2013 | Adams et al. |
| 2013/0179351 A1 | 7/2013 | Wallner |
| 2013/0185772 A1 | 7/2013 | Jaudon et al. |
| 2013/0191279 A1 | 7/2013 | Calman et al. |
| 2013/0200999 A1 | 8/2013 | Spodak et al. |
| 2013/0216108 A1 | 8/2013 | Hwang et al. |
| 2013/0226791 A1 | 8/2013 | Springer et al. |
| 2013/0226796 A1 | 8/2013 | Jiang et al. |
| 2013/0232082 A1 | 9/2013 | Krawczewicz et al. |
| 2013/0238894 A1 | 9/2013 | Ferg et al. |
| 2013/0282360 A1 | 10/2013 | Shimota et al. |
| 2013/0303085 A1 | 11/2013 | Boucher et al. |
| 2013/0304651 A1 | 11/2013 | Smith |
| 2013/0312082 A1 | 11/2013 | Izu et al. |
| 2013/0314593 A1 | 11/2013 | Reznik et al. |
| 2013/0344857 A1 | 12/2013 | Berionne et al. |
| 2014/0002238 A1 | 1/2014 | Taveau et al. |
| 2014/0019352 A1 | 1/2014 | Shrivastava |
| 2014/0027506 A1 | 1/2014 | Heo et al. |
| 2014/0032409 A1 | 1/2014 | Rosano |
| 2014/0032410 A1 | 1/2014 | Georgiev et al. |
| 2014/0040120 A1 | 2/2014 | Cho et al. |
| 2014/0040139 A1 | 2/2014 | Brudnicki et al. |
| 2014/0040147 A1 | 2/2014 | Varadarakan et al. |
| 2014/0047235 A1 | 2/2014 | Lessiak et al. |
| 2014/0067690 A1 | 3/2014 | Pitroda et al. |
| 2014/0074637 A1 | 3/2014 | Hammad |
| 2014/0074655 A1 | 3/2014 | Lim et al. |
| 2014/0081720 A1 | 3/2014 | Wu |
| 2014/0138435 A1 | 5/2014 | Khalid |
| 2014/0171034 A1 | 6/2014 | Aleksin et al. |
| 2014/0171039 A1 | 6/2014 | Bjontegard |
| 2014/0172700 A1 | 6/2014 | Teuwen et al. |
| 2014/0180851 A1 | 6/2014 | Fisher |
| 2014/0208112 A1 | 7/2014 | McDonald et al. |
| 2014/0214674 A1 | 7/2014 | Narula |
| 2014/0229375 A1 | 8/2014 | Zaytzsev et al. |
| 2014/0245391 A1 | 8/2014 | Adenuga |
| 2014/0256251 A1 | 9/2014 | Caceres et al. |
| 2014/0258099 A1 | 9/2014 | Rosano |
| 2014/0258113 A1 | 9/2014 | Gauthier et al. |
| 2014/0258125 A1 | 9/2014 | Gerber et al. |
| 2014/0274179 A1 | 9/2014 | Zhu et al. |
| 2014/0279479 A1 | 9/2014 | Maniar et al. |
| 2014/0337235 A1 | 11/2014 | Van Heerden et al. |
| 2014/0339315 A1 | 11/2014 | Ko |
| 2014/0346860 A1 | 11/2014 | Aubry et al. |
| 2014/0365780 A1 | 12/2014 | Movassaghi |
| 2014/0379361 A1 | 12/2014 | Mahadkar et al. |
| 2015/0012444 A1 | 1/2015 | Brown et al. |
| 2015/0032635 A1 | 1/2015 | Guise |
| 2015/0071486 A1 | 3/2015 | Rhoads et al. |
| 2015/0088757 A1 | 3/2015 | Zhou et al. |
| 2015/0089586 A1 | 3/2015 | Ballesteros |
| 2015/0134452 A1 | 5/2015 | Williams |
| 2015/0140960 A1 | 5/2015 | Powell et al. |
| 2015/0154595 A1 | 6/2015 | Collinge et al. |
| 2015/0170138 A1 | 6/2015 | Rao |
| 2015/0178724 A1 | 6/2015 | Ngo et al. |
| 2015/0186871 A1 | 7/2015 | Laracey |
| 2015/0205379 A1 | 7/2015 | Mag et al. |
| 2015/0302409 A1 | 10/2015 | Malek et al. |

(56) References Cited

U.S. PATENT DOCUMENTS

| | | |
|---|---|---|
| 2015/0317626 A1 | 11/2015 | Ran et al. |
| 2015/0332266 A1 | 11/2015 | Friedlander et al. |
| 2015/0339474 A1 | 11/2015 | Paz et al. |
| 2015/0371234 A1 | 12/2015 | Huang et al. |
| 2016/0012465 A1 | 1/2016 | Sharp |
| 2016/0026997 A1 | 1/2016 | Tsui et al. |
| 2016/0048913 A1 | 2/2016 | Rausaria et al. |
| 2016/0055480 A1 | 2/2016 | Shah |
| 2016/0057619 A1 | 2/2016 | Lopez |
| 2016/0065370 A1 | 3/2016 | Le Saint et al. |
| 2016/0087957 A1 | 3/2016 | Shah et al. |
| 2016/0092696 A1 | 3/2016 | Guglani et al. |
| 2016/0148193 A1 | 5/2016 | Kelley et al. |
| 2016/0232523 A1 | 8/2016 | Venot et al. |
| 2016/0239672 A1 | 8/2016 | Khan et al. |
| 2016/0253651 A1 | 9/2016 | Park et al. |
| 2016/0255072 A1 | 9/2016 | Liu |
| 2016/0267486 A1 | 9/2016 | Mitra et al. |
| 2016/0277383 A1 | 9/2016 | Guyomarc'h et al. |
| 2016/0277388 A1 | 9/2016 | Lowe et al. |
| 2016/0307187 A1 | 10/2016 | Guo et al. |
| 2016/0307189 A1 | 10/2016 | Zarakas et al. |
| 2016/0314472 A1 | 10/2016 | Ashfield |
| 2016/0330027 A1 | 11/2016 | Ebrahimi |
| 2016/0335531 A1 | 11/2016 | Mullen et al. |
| 2016/0379217 A1 | 12/2016 | Hammad |
| 2017/0004502 A1 | 1/2017 | Quentin et al. |
| 2017/0011395 A1 | 1/2017 | Pillai et al. |
| 2017/0011406 A1 | 1/2017 | Tunnell et al. |
| 2017/0017957 A1 | 1/2017 | Radu |
| 2017/0017964 A1 | 1/2017 | Janefalkar et al. |
| 2017/0024716 A1 | 1/2017 | Jiam et al. |
| 2017/0039566 A1 | 2/2017 | Schipperheijn |
| 2017/0041759 A1 | 2/2017 | Gantert et al. |
| 2017/0068950 A1 | 3/2017 | Kwon |
| 2017/0103388 A1 | 4/2017 | Pillai et al. |
| 2017/0104739 A1 | 4/2017 | Lansler et al. |
| 2017/0109509 A1 | 4/2017 | Baghdasaryan |
| 2017/0109730 A1 | 4/2017 | Locke et al. |
| 2017/0116447 A1 | 4/2017 | Cimino et al. |
| 2017/0124568 A1 | 5/2017 | Moghadam |
| 2017/0140379 A1 | 5/2017 | Deck |
| 2017/0154328 A1 | 6/2017 | Zarakas et al. |
| 2017/0154333 A1 | 6/2017 | Gleeson et al. |
| 2017/0180134 A1 | 6/2017 | King |
| 2017/0230189 A1 | 8/2017 | Toll et al. |
| 2017/0237301 A1 | 8/2017 | Elad et al. |
| 2017/0289127 A1 | 10/2017 | Hendrick |
| 2017/0295013 A1 | 10/2017 | Claes |
| 2017/0316696 A1 | 11/2017 | Bartel |
| 2017/0317834 A1 | 11/2017 | Smith et al. |
| 2017/0330173 A1 | 11/2017 | Woo et al. |
| 2017/0374070 A1 | 12/2017 | Shah et al. |
| 2018/0034507 A1 | 2/2018 | Wobak et al. |
| 2018/0039986 A1 | 2/2018 | Essebag et al. |
| 2018/0068316 A1 | 3/2018 | Essebag et al. |
| 2018/0129945 A1 | 5/2018 | Saxena et al. |
| 2018/0160255 A1 | 6/2018 | Park |
| 2018/0191501 A1 | 7/2018 | Lindemann |
| 2018/0205712 A1 | 7/2018 | Versteeg et al. |
| 2018/0240106 A1 | 8/2018 | Garrett et al. |
| 2018/0254909 A1 | 9/2018 | Hancock |
| 2018/0268132 A1 | 9/2018 | Buer et al. |
| 2018/0270214 A1 | 9/2018 | Caterino et al. |
| 2018/0294959 A1 | 10/2018 | Traynor et al. |
| 2018/0300716 A1 | 10/2018 | Carlson |
| 2018/0302396 A1 | 10/2018 | Camenisch et al. |
| 2018/0315050 A1 | 11/2018 | Hammad |
| 2018/0316666 A1 | 11/2018 | Koved et al. |
| 2018/0322486 A1 | 11/2018 | Deliwala et al. |
| 2018/0359100 A1 | 12/2018 | Gaddam et al. |
| 2019/0014107 A1 | 1/2019 | George |
| 2019/0019375 A1 | 1/2019 | Foley |
| 2019/0036678 A1 | 1/2019 | Ahmed |
| 2019/0238517 A1 | 8/2019 | D'Agostino et al. |

FOREIGN PATENT DOCUMENTS

| | | |
|---|---|---|
| CN | 103023643 A | 4/2013 |
| CN | 103417202 A | 12/2013 |
| EP | 1085424 A1 | 3/2001 |
| EP | 1223565 A1 | 7/2002 |
| EP | 1265186 A2 | 12/2002 |
| EP | 0862134 B1 | 1/2005 |
| EP | 1783919 A1 | 5/2007 |
| EP | 2139196 A1 | 12/2009 |
| EP | 1469419 A1 | 8/2012 |
| EP | 2852070 A1 | 3/2015 |
| GB | 2457221 A | 8/2009 |
| GB | 2516861 A | 2/2015 |
| GB | 2551907 A | 1/2018 |
| KR | 101508320 B1 | 4/2015 |
| WO | 0049586 A1 | 8/2000 |
| WO | 2006070189 A2 | 7/2006 |
| WO | 2008055170 A2 | 5/2008 |
| WO | 2009025605 A2 | 2/2009 |
| WO | 2010049252 A1 | 5/2010 |
| WO | 2011112158 A1 | 9/2011 |
| WO | 2012001624 A1 | 1/2012 |
| WO | 2013039395 A1 | 3/2013 |
| WO | 2013155562 A1 | 10/2013 |
| WO | 2013192358 A2 | 12/2013 |
| WO | 2014043278 A1 | 3/2014 |
| WO | 2014170741 A2 | 10/2014 |
| WO | 2015179649 A1 | 11/2015 |
| WO | 2015183818 A1 | 12/2015 |
| WO | 2016097718 A1 | 6/2016 |
| WO | 2016160816 A1 | 10/2016 |
| WO | 2016168394 A1 | 10/2016 |
| WO | 2017042375 A1 | 3/2017 |
| WO | 2017042400 A1 | 3/2017 |
| WO | 2017157859 A1 | 9/2017 |
| WO | 2017208063 A1 | 12/2017 |
| WO | 2018063809 A1 | 4/2018 |
| WO | 2018137888 A1 | 8/2018 |

OTHER PUBLICATIONS

Haykin, M. And Warnar, R., "Smart Card Technology: New Methods for Computer Access Control", Computer Science and Technology NIST Special Publication 500-157:1-60 (1988).

Lehpamer, H., "Component of the RFID System", RFID Design Principles, 2nd edition pp. 133-201 (2012).

Author Unknown, "CardrefresherSM from American Express®", [online] 2019 [retrieved on Mar. 25, 2019]. Retrieved from Internet URL: https://merchant-channel.americanexpress.com/merchant/en_US/cardrefresher, 2 pages.

Author Unknown, "Add Account Updater to your recurring payment tool", [online] 2018-19 [retrieved on Mar. 25, 2019]. Retrieved from Internet URL: https://www.authorize.net/our-features/account-updater/, 5 pages.

Author Unknown, "Visa® Account Updater for Merchants", [online] 2019 [retrieved on Mar. 25, 2019]. Retrieved from Internet URL: https://usa.visa.com/dam/VCOM/download/merchants/visa-account-updater-product-information-fact-sheet-for-merchants.pdf, 2 pages.

Author Unknown, "Manage the cards that you use with Apple Pay", Apple Support [online] 2019 [retrieved on Mar. 25, 2019]. Retrieved from Internet URL: https://support.apple.com/en-us/HT205583, 5 pages.

Author Unknown, "Contactless Specifications for Payment Systems", EMV Book B—Entry Point Specification [online] 2016 [retrieved on Mar. 25, 2019]. Retrieved from Internet URL: https://www.emvco.com/wp-content/uploads/2017/05/BookB_Entry_Point_Specification_v2_6_20160809023257319.pdf, 52 pages.

Author Unknown, "EMV Integrated Circuit Card Specifcations for Payment Systems, Book 2, Security and Key Management," Version 3.4, [online] 2011 [retrieved on Mar. 25, 2019]. Retrieved from Internet URL: https://www.emvco.com/wp-content/uploads/2017/05/EMV_v4.3_Book_2_Security_and_Key_Management_20120607061923900.pdf, 174 pages.

(56) References Cited

OTHER PUBLICATIONS

Author Unknown, "NFC Guide: All You Need to Know About Near Field Communication", Square Guide [online] 2018 [retrieved on Nov. 13, 2018]. Retrieved from Internet URL: https://squareup.com/guides/nfc, 8 pages.

Profis, S., "Everything you need to know about NFC and mobile payments" CNET Directory [online], 2014 [retrieved on Mar. 25, 2019]. Retrieved from the Internet URL: https://www.cnet.com/how-to/how-nfc-works-and-mobile-payments/, 6 pages.

Cozma, N., "Copy data from other devices in Android 5.0 Lollipop setup", CNET Directory [online] 2014 [retrieved on Mar. 25, 2019]. Retrieved from the Internet URL: https://www.cnet.com/how-to/copy-data-from-other-devices-in-android-5-0-lollipop-setup/, 5 pages.

Kevin, Android Enthusiast, "How to copy text string from nfc tag", StackExchange [online] 2013 [retrieved on Mar. 25, 2019]. Retrieved from the Internet URL: https://android.stackexchange.com/questions/55689/how-to-copy-text-string-from-nfc-tag, 11 pages.

Author Unknown, "Tap & Go Device Setup", Samsung [online] date unknown [retrieved on Mar. 25, 2019]. Retrieved from the Internet URL: https://www.samsung.com/us/switch-me/switch-to-the-galaxy-s-5/app/partial/setup-device/tap-go.html, 1 page.

Author Unknown, "Multiple encryption", Wikipedia [online] 2019 [retrieved on Mar. 25, 2019]. Retrieved from Internet URL: https://en.wikipedia.org/wiki/Multiple_encryption, 4 pages.

Krawczyk, et al., "HMAC: Keyed-Hashing for Message Authentication", Network Working Group RFC:2104 memo [online] 1997 [retrieved on Mar. 25, 2019]. Retrieved from Internet URL: https://tools.ietf.org/html/rfc2104, 12 pages.

Song, et al., "The AES-CMAC Algorithm", Network Working Group RFC: 4493 memo [online] 2006 [retrieved on Mar. 25, 2019]. Retrieved from Internet URL: https://tools.ietf.org/html/rfc4493, 21 pages.

Katz, J. and Lindell, Y., "Aggregate Message Authentication Codes", Topics in Cryptology [online] 2008 [retrieved on Mar. 25, 2019]. Retrieved from Internet URL: https://www.cs.umd.edu/~jkatz/papers/aggregateMAC.pdf, 11 pages.

Adams, D., and Maier, A-K., "Goldbug Big Seven open source crypto-messengers to be compared—or: Comprehensive Confidentiality Review & Audit of GoldBug Encrypting E-Mail-Client & Secure Instant Messenger", Big Seven Study 2016 [online] [retrieved on Mar. 25, 2018]. Retrieved from Internet URL: https://sf.net/projects/goldbug/files/bigseven-crypto-audit.pdf, 309 pages.

Author Unknown, "Triple DES", Wikipedia [online] 2018 [retrieved on Mar. 25, 2019]. Retrieved from Internet URL: https://simple.wikipedia.org/wiki/Triple_DES, 2 pages.

Song F., and Yun, A.I., "Quantum Security of NMAC and Related Constructions—PRF domain extension against quantum attacks", IACR Cryptology ePrint Archive [online] 2017 [retrieved on Mar. 25, 2019]. Retrieved from Internet URL: https://eprintiacr.org/2017/509.pdf, 41 pages.

Saxena, N., "Lecture 10: NMAC, HMAC and Number Theory", CS 6903 Modern Cryptography [online] 2008 [retrieved on Mar. 25, 2019]. Retrieved from Internet URL: http://isis.poly.edu/courses/cs6903/Lectures/lecture10.pdf, 8 pages.

Berg, G., "Fundamentals of EMV", Smart Card Alliance [online] date unknown [retrieved on Mar. 27, 2019]. Retrieeved from Internet URL: https://www.securetechalliance.org/resources/media/scap13_preconference/02.pdf, 37 pages.

Pierce, K., "Is the amazon echo nfc compatible?", Amazon.com Customer Q&A [online] 2016 [retrieved on Mar. 26, 2019]. Retrieved from Internet URL: https://www.amazon.com/ask/questions/Tx1RJXYSPE6XLJD?_encodi . . . , 2 pages.

Author Unknown, "Multi-Factor Authentication", idaptive [online] 2019 [retrieved on Mar. 25, 2019]. Retrieved from Internet URL: https://www.centrify.com/products/application-services/adaptive-multi-factor-authentication/risk-based-mfa/, 10 pages.

Author Unknown, "Adaptive Authentication", SecureAuth [online] 2019 [retrieved on Mar. 25, 2019} Retrieved from Internet URL: https://www.secureauth.com/products/access-management/adaptive-authentication, 7 pages.

Van den Breekel, J., et al., "EMV in a nutshell", Technical Report, 2016 [retrieved on Mar. 25, 2019]. Retrieved from Internet URL: https://www.cs.ru.nl/E.Poll/papers/EMVtechreport.pdf, 37 pages.

Author Unknown, "Autofill", Computer Hope [online] 2018 [retrieved on Mar. 25, 2019]. Retrieved from Internet URL: https://www.computerhope.com/jargon/a/autofill.htm, 2 pages.

Author Unknown, "Fill out forms automatically", Google Chrome Help [online] 2019 [retrieved on Mar. 25, 2019]. Retrieved from Internet URL: https://support.google.com/chrome/answer/142893?co=GENIE.Platform%3DDesktop&hl=en, 3 pages.

Author Unknown, "Autofill credit cards, contacts, and passwords in Safari on Mac", Apple Safari User Guide [online] 2019 [retrieved on Mar. 25, 2019]. Retrieved from Internet URL: https://support.apple.com/guide/safari/use-autofill-ibrw1103/mac, 3 pages.

Menghin, M.J., "Power Optimization Techniques for Near Field Communication Systems", 2014 Dissertation at Technical University of Graz [online]. Retrieved from Internet URL: https://diglib.tugraz.at/download.php?id=576a7b910d2d6&location=browse, 135 pages.

Mareli, M., et al., "Experimental evaluation of NFC reliability between an RFID tag and a smartphone", Conference paper (2013) IEEE AFRICON At Mauritius [online] [retrieved on Mar. 25, 2019]. Retrieved from Internet URL: https://core.ac.uk/download/pdf/54204839.pdf, 5 pages.

Davison, A., et al., "MonoSLAM: Real-Time Single Camera SLAM", IEEE Transactions on Pattern Analysis and Machine Intelligence 29(6): 1052-1067 (2007).

Barba, R., "Sharing your location with your bank sounds creepy, but it's also useful", Bankrate, LLC [online] 2017 [retrieved on Mar. 25, 2019]. Retrieved from Internet URL: https://www.bankrate.com/banking/banking-app-location-sharing/, 6 pages.

Author Unknown: "onetappayment™", [online] Jan. 24, 2019, [retrieved on Mar. 25, 2019]. Retrieved from Internet URL: https://www.payubiz.in/onetap, 4 pages.

Vu, et al., "Distinguishing users with capacitive touch communication", Proceedings of the Annual International Conference on Mobile Computing and Networking, 2012, MOBICOM. 101145/2348543.2348569.

Pourghomi, P., et al., "A Proposed NFC Payment Application," International Journal of Advanced Computer Science and Applications, 4(8):173-181 (2013).

Author unknown, "EMV Card Personalization Specification", EMVCo., LLC., specification version 1.0, (2003) 81 pages.

Ullmann et al., "On-Card" User Authentication for Contactless Smart Cards based on Gesture Recognition, paper presentation LNI proceedings, (2012) 12 pages.

Faraj, S.T., et al., "Investigation of Java Smart Card Technology for Multi-Task Applications", J of Al-Anbar University for Pure Science, 2(1):23 pages (2008).

Dhamdhere, P., "Key Benefits of a Unified Platform for Loyalty, Referral Marketing, and UGC" Annex Cloud [online] May 19, 2017 [retrieved on Jul. 3, 2019]. Retrieved from Internet URL: https://www.annexcloude.com/blog/benefits-unified-platform/, 13 pages.

* cited by examiner

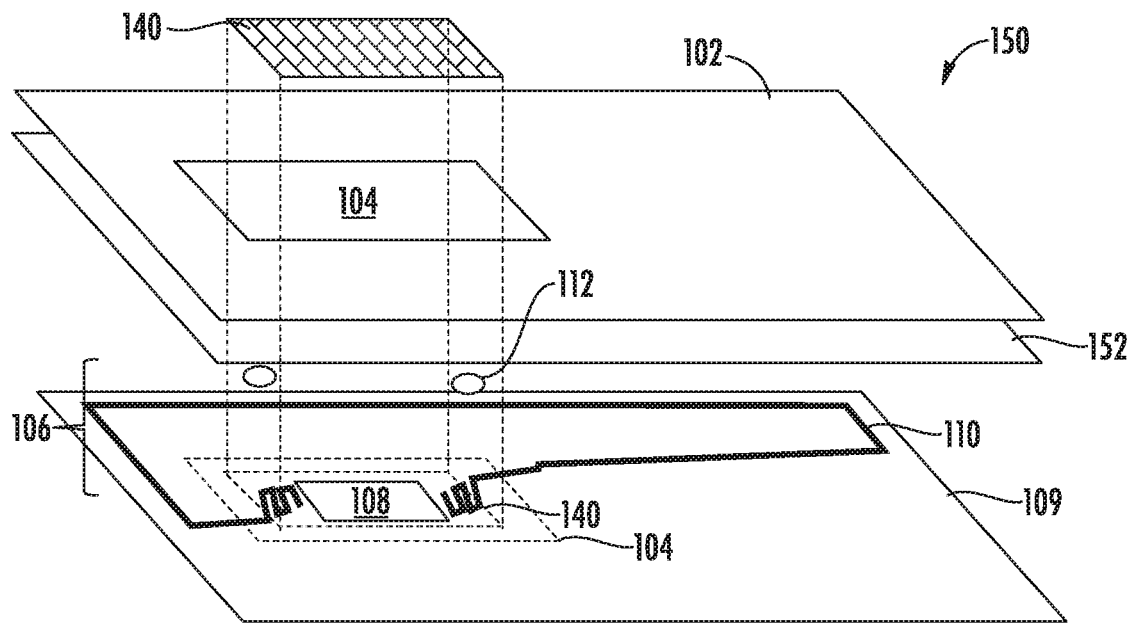
FIG. 3
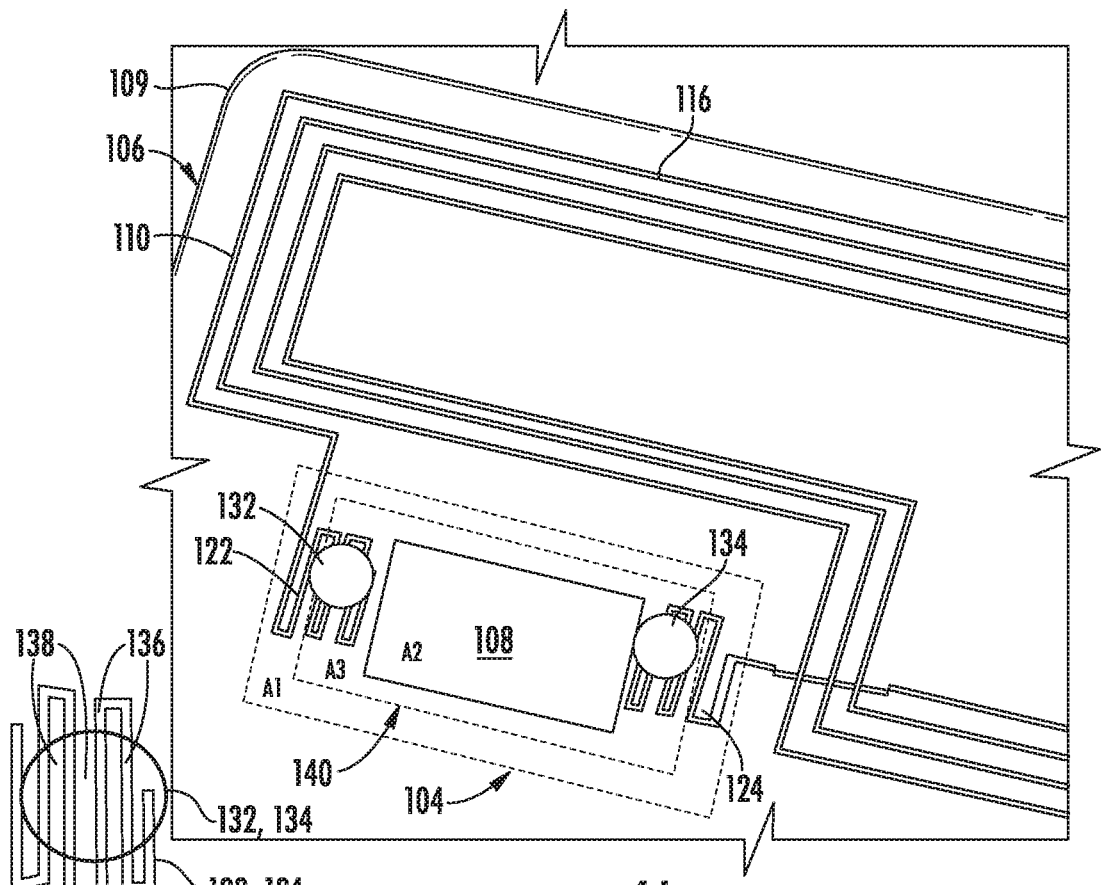
FIG. 4B
FIG. 4A

CONTACTLESS CARD AND METHOD OF ASSEMBLY

FIELD

Embodiments of the present disclosure relate to transaction cards and, more particularly, to transaction cards having a metallic body.

BACKGROUND

Generally, transaction cards such as smart credit/debit cards, access cards, EMV cards, and the like may include components such as electronic chips to perform memory storage, computing, or communication functions. Transaction cards having electronic chips generally include a region on or near the card surface to embed the electronic chip. Such cards may or may not have contactless capabilities. Contactless capability enables wireless communication using radio frequency (RF) signals provided by radio communication functionality built into the contactless card.

Metal transaction cards, such as metal credit cards, have enjoyed increasing popularity in recent years. Because the body of a metal credit cards is electrically conductive, there are various difficulties in fabricating a metal credit card, especially in the case of contactless cards that incorporate an electrically conductive antenna such as in the shape of a coil. One approach is to laminate a coil onto one side of the metal card. In the case of assembling a plastic transaction card, a layered stack formed of a front layer, back layer and coil may be preassembled, so that the electronic chip may be placed in the preassembled layer stack to be bonded to the other components of the card, using a conductive material. However, this bonding approach is somewhat imprecise, and does not present a robust approach for forming metal contactless cards, due to the possibility of accidental contact of the metal card body with the conductive material.

With respect to the above considerations, the present embodiments are provided.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, a method of forming a contactless transaction card is provided. The method may include providing a card body, defining a window, and attaching an antenna assembly layer to the card body, where the antenna assembly layer includes an antenna, a set of curable connectors, disposed on a set of end regions of the antenna within the window, and a UV-transparent layer, supporting the antenna. The method may include providing a contactless chip module within the window on a first side of the antenna assembly layer, and directing radiation through the UV-transparent layer, wherein the contactless chip module is electrically connected to the antenna via the curable connectors.

In a further embodiment, a contactless transaction card is provided. The contactless transaction card may include a card body, defining a window, and an antenna assembly layer, disposed subjacent the card body, where the antenna assembly layer includes an antenna, comprising a set of end regions, a UV-transparent layer, supporting the antenna, and a set of curable connectors, disposed on the set of end regions. The set of end regions, and set of curable connectors may be disposed within the window. The contactless transaction card may further include a contactless chip module, disposed within the window, and electrically connected to the set of end regions, via the set of curable connectors.

In another embodiment, a method of forming a contactless transaction card, may include providing a card body that defines a window, and coupling an antenna assembly layer to the card body, where the antenna assembly layer includes an antenna, and a transparent layer, supporting the antenna. The method may include providing a first curable connector on a first end region of the antenna, and a second curable connector on a second end region of the antenna, wherein the first end region, the second end region, the first curable connector and the second curable connector are disposed in the window. The method may also include providing a contactless chip module within the window on a first side of the transparent layer, and directing radiation through the transparent layer from a second side of the transparent layer, opposite the first side. As such, the contactless chip module may be electrically connected to the antenna via the first curable connector and the second curable connector.

BRIEF DESCRIPTION OF THE DRAWINGS

The accompanying drawings illustrate example approaches of the disclosure, including the practical application of the principles thereof, as follows:

FIG. 3 is a side exploded view of another variant of the contactless card of FIG. 1, in accordance with embodiments of the present disclosure;

FIG. 4A is a top view illustrating an antenna assembly layer according to some embodiments of the disclosure;

FIG. 4B is a top view illustrating details of end region of an antenna, according to embodiments of the disclosure;

Figure 1:
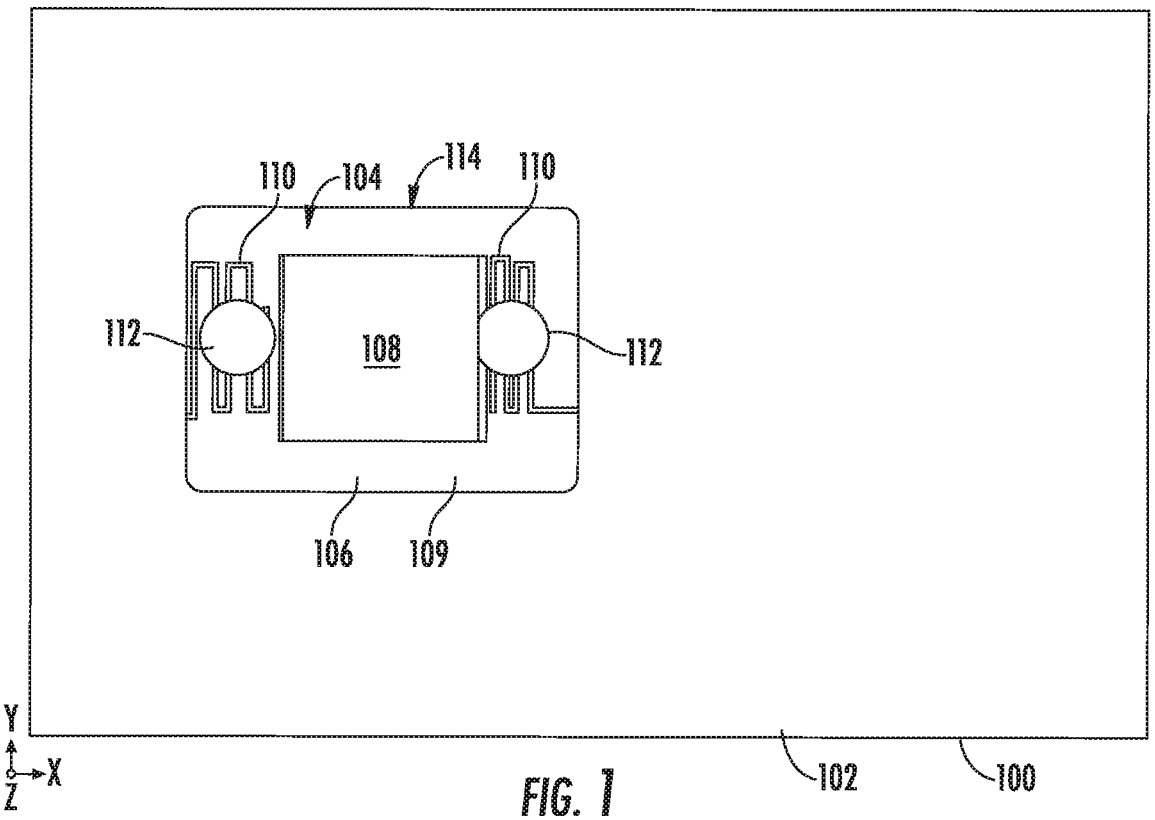
FIG. 1 is a top view illustrating a contactless card, in accordance with embodiments of the present disclosure.

The drawings are not necessarily to scale. The drawings are merely representations, not intended to portray specific parameters of the disclosure. The drawings are intended to depict example embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

Embodiments herein are directed to contactless transaction cards including an electronic chip module, or semiconductor chip module, as well as an antenna. The present embodiments may be suitable, for example, in transaction cards having a metallic or otherwise electrically conductive body.

Figure 2:
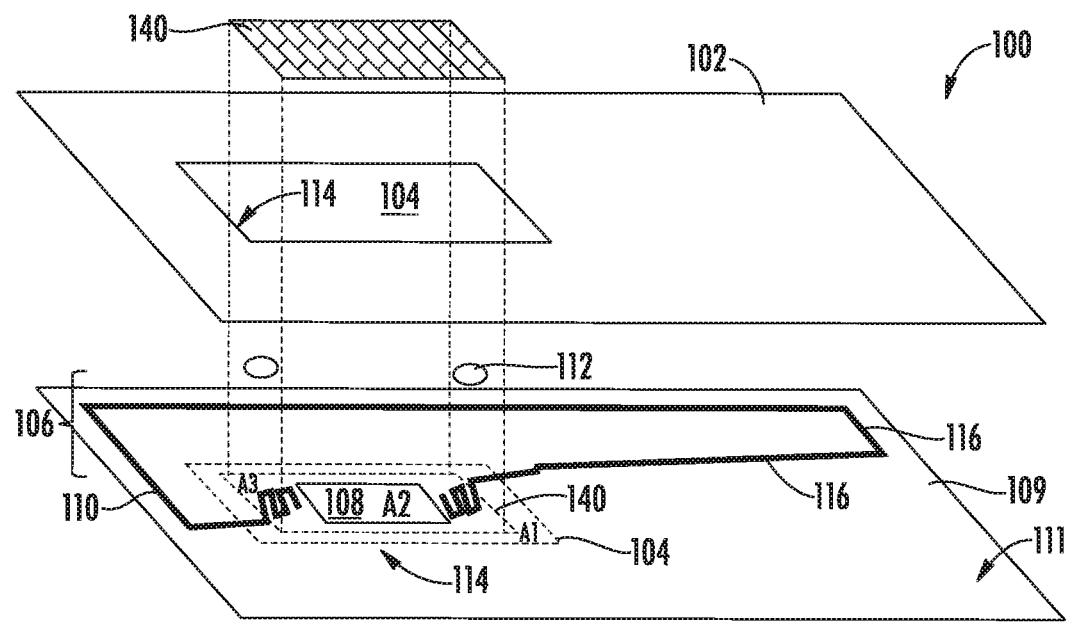
FIG. 2 is a side exploded view of a variant of the contactless card of FIG. 1, in accordance with embodiments of the present disclosure.

FIG. 1 is a top view illustrating a contactless card 100, arranged in accordance with embodiments of the present disclosure. FIG. 2 is a side exploded view of a variant of the contactless card of FIG. 1, in accordance with embodiments of the present disclosure, while FIG. 3 is a side exploded view of another variant of the contactless card of FIG. 1, in accordance with embodiments of the present disclosure.

As used herein, the term contactless card may refer to a transaction card, such as a credit card, debit card, or other card. The contactless card may include an electronic component, such as a semiconductor chip, or semiconductor chip module, as well as circuitry for wireless communication, such as an antenna. In various embodiments, contactless cards as detailed herein may be arranged in conformance with SO/IEC 7816, an international standard related to electronic identification cards with contacts, where the standard is managed jointly by the International Organization for Standardization (ISO) and the International Electrotechnical Commission (IEC).

As shown in FIG. 2, for example, the contactless card 100 may be arranged with a card body 102. In accordance with various embodiments, the card body 102 may formed of a metallic material. In these embodiments, the contactless card 100 may thus be deemed a metallic contactless card. Generally a card body of the contactless cards of the present embodiments may constitute a relatively thicker layer of a transaction card as opposed to other layers that are laminated together with the card body to form the complete contactless card. As shown in FIG. 1, for example, the contactless card 100 includes a window 104, representing an aperture or recess to accommodate an electronic chip module, which module may include an electronic chip and packaging, such as contacts, for electrically coupling to external components. In the embodiments of FIG. 1-3, the electronic chip module is configured to contact an antenna, for example, and is referred to herein as a contactless chip module 140. The contactless card 100 may include an antenna assembly layer 106, which layer is attached to the card body 102 after assembly. The antenna assembly layer 106 may include an antenna 110, a set of curable connectors 112, disposed on a set of end regions of the antenna 110 that lie within the window 104, and a UV-transparent layer 109, supporting the antenna 110. The set of end regions are shown as serpentine regions, located at opposite ends of the antenna 110. In various embodiments, these components of the antenna assembly layer 106 may be assembled to one another before attachment to other components of the contactless card 100, as detailed below.

As shown in FIG. 2, the contactless card 100 may also include a contactless chip module 140, within the window 104, and disposed on a first side of the antenna assembly layer 106, where the first side 111, is an upper side in the view of FIG. 2. When fully assembled the contactless chip module 140 may be electrically connected to the set of end regions, via the set of curable connectors 112. For example, the electronic chip module 140 may include a semiconductor die (not separately shown) and a set of contacts or leads that come into contact with the curable connectors 112.

As shown in FIG. 1, the curable connectors 112 may lie within the window 104 so as not to be in contact with the card body 102. Thus, in the case where the card body 102 is a metallic body, the curable connectors 112 and the antenna 110 will not be electrically shorted to the card body 102. As further shown in FIG. 2, the contactless chip module 140 may lie within the window 104 so as not to electrically contact the card body 102 at the edges 114 of the window 104.

Notably, while the antenna 110 may be disposed on the first side 111 of the UV-transparent layer 109, facing the card body 102, an insulator material, meaning an electrical insulator, may be disposed between the antenna 110 and the card body 102 in the outer region of the antenna 110 that lies outside of the window 104. In one example, the antenna 110 may be formed with a metallic core that is covered with an insulating coating. Thus, when assembled, where the card body 102 is bonded to the UV-transparent layer 109, the metallic core of the antenna 110 is still electrically isolated from the card body 102, preventing any electrical shorting between the antenna 110 and card body 102 in embodiments where the card body 102 is formed of a metallic material.

As further illustrated in FIG. 1 and FIG. 2, the UV-transparent layer 109 may define a recess 108. As shown in FIG. 2, the recess 108 is aligned within the window 104, such as being centered within the window 104. As shown in FIG. 2, the window 104 defines a first area (A1, the area within the dotted line, where the area is defined within the X-Y plane of the Cartesian coordinate system shown in FIG. 1), while the recess 108 defines a second area (A2, the area within the solid line) that is smaller than the first area. Notably, the contactless chip module 140 defines a third area (A3) intermediate in size between the first area and the second area.

FIG. 3 presents another embodiment of a contactless card 150, where the contactless card 150 includes various components of the contactless card 100, as discussed above. In this embodiment, an electrically insulating layer, shown as layer 152, is disposed between the antenna assembly layer 106 and the card body 102 to provide electrical isolation between the antenna 110 of antenna assembly layer 106 and the card body 102. Notably, the layer 152 may include an opening to form part of the window 104 in the region of the contactless chip module 140, to accommodate the contactless chip module 140 for connection to the antenna 110.

To assemble the contactless card 100 or contactless card 150, when the contactless chip module 140 is joined to the antenna assembly layer 106, the contactless chip module 140 may be aligned within the window 104, such as being generally centered within the window 104. Accordingly, when assembled, in the embodiments of FIGS. 2 and 3, the contactless chip module 140 is arranged within the window 104, and in electrical contact with the antenna 110 via the curable connectors 112, without contacting the card body 102.

To illustrate further details of the geometry for assembling a contactless card FIG. 4A is a top view showing details of the antenna assembly layer 106 according to some embodiments of the disclosure. In this view, a portion of antenna assembly layer 106 is shown that lies within the window 104, as well as an outer portion 116 of the antenna assembly layer 106 that lies subjacent to the card body 102, as explained previously. The antenna 110 may define any suitable shape, as generally shown in FIG. 4A. In two different end regions, the antenna 110 terminates within the window 104, as shown. In particular, an end region 122 and an end region 124 of the antenna 110 are arranged towards opposite sides of the window 104. In embodiments where the UV-transparent layer 109 includes the recess 108, the end region 122 and end region 124 may be arranged on opposite sides of the recess 108.

In particular embodiments, the set of end regions of an antenna, such as end region 122 and end region 124, may be arranged in a serpentine pattern (shown in FIG. 4A), spiral pattern, or other pattern. As further illustrated in FIG. 4A, a first curable connector 132 and a second curable connector 134 are arranged over the end region 122 and the end region 124, respectively. Moreover, the first curable connector 132 extends partially over the end region 122 of the antenna 110, and partially over an exposed region of the UV-transparent layer 109.

In particular, as shown in the detailed view of FIG. 4B, the serpentine pattern of the end region 122 or end region 124 defines open areas of the UV-transparent layer 109 that are not covered by the antenna 110. Thus, first regions 136 of the first curable connector 132 or second curable connector 134 will lie directly over the material of antenna 110, which material may be an opaque metal wire or foil. Second regions 138 of the first curable connector 132, or second curable connector 134 will lie directly over exposed regions of the UV-transparent layer 109. These second regions 138 will be directly exposed to light such as UV radiation and/or visible radiation that is directed to the underside of the UV-transparent layer 109, that is the side opposite to first side 111, defined above.

To facilitate assembly of the contactless card 100 or contactless card 150, for example, the curable connectors 112 (shown as first curable connector 132 and second curable connector 134 in FIG. 4A) may be formed of a conductive adhesive. Examples of a suitable conductive adhesive according to the present embodiments include a conductive epoxy material, or similar conductive composite. The conductive adhesive may be applied on top of the end region 122 and end region 124 as a dot or similarly shaped object, as suggested by the illustration of FIG. 4A. The first curable connector 132 and second curable connector 134 may be placed well away from the edge 114 of the window 104, so that when a card body 102 is brought into contact with the antenna assembly layer 106, the first curable connector 132 and second curable connector 134 do not deform sufficiently to touch the edge 114, avoiding electrical connection between the antenna 110 and card body 102.

Thus, with reference again to FIGS. 2 and 3, the aforementioned embodiments of a contactless card may be formed by the process of attaching the antenna assembly layer 106 to the card body 102, with optional layers disposed between the antenna assembly layer 106 and card body, such as in the embodiment of FIG. 3. As such, a window 104, already defined at least partially within the card body 102, will form a recess that extends at least to the top surface of the antenna assembly layer 106.

A contactless chip module 140 may then be provided within the window 104 on the first side 111 of antenna assembly layer 106. To affix the contactless chip module in the contactless card, and to electrically connect the contactless chip module to the antenna 110, the contactless chip module 140 may be brought into contact with the curable connectors 112 (or first curable connector 132, second curable connector 134), so the curable connectors 112 may be cured while in contact with the contactless chip module 140. In this manner, after curing, a mechanical bond and an electrical connection is established between the antenna 110 and contactless chip module 140.

Advantageously, the curing of curable connectors 112 may take place by directing short exposures of radiation through the UV-transparent layer 109, while the contactless chip module 140 is in place within the window 104. The curable connectors 112 may be formed of a chemical or set of chemicals that are amenable to curing when exposed to suitable radiation, such as ultraviolet radiation.

Figure 5:
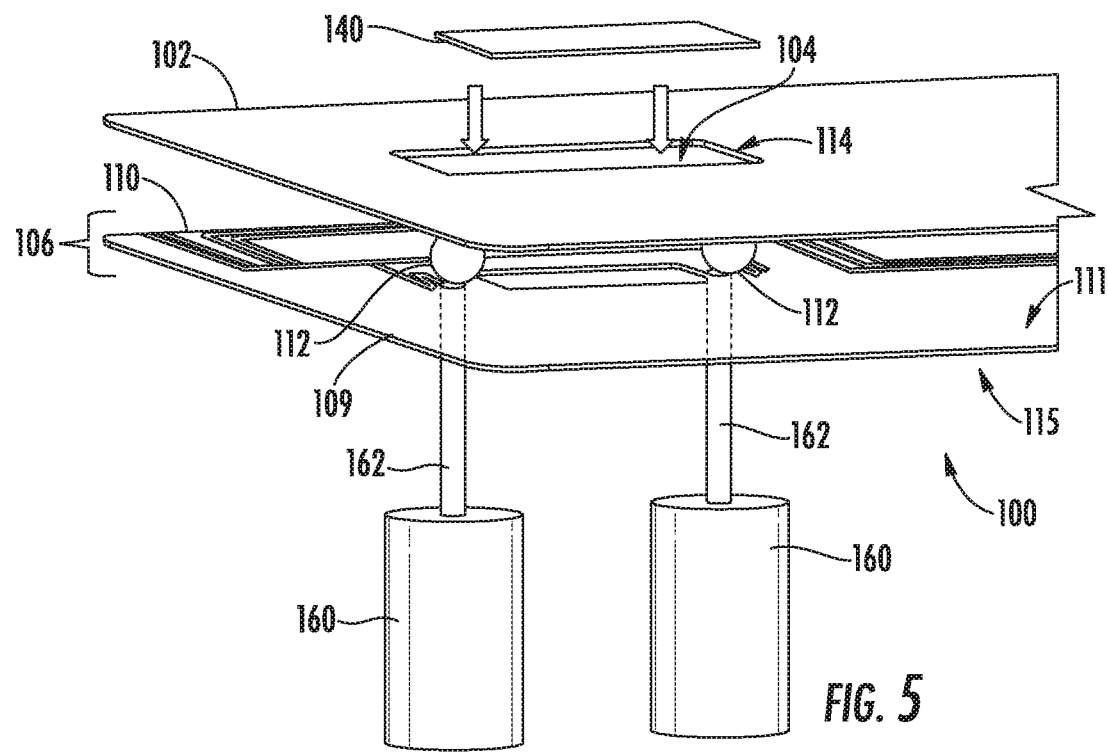
FIG. 5 is a side exploded view of a contactless card illustrating one instance during fabrication of a contactless card, in accordance with embodiments of the present disclosure.
Figure 6:
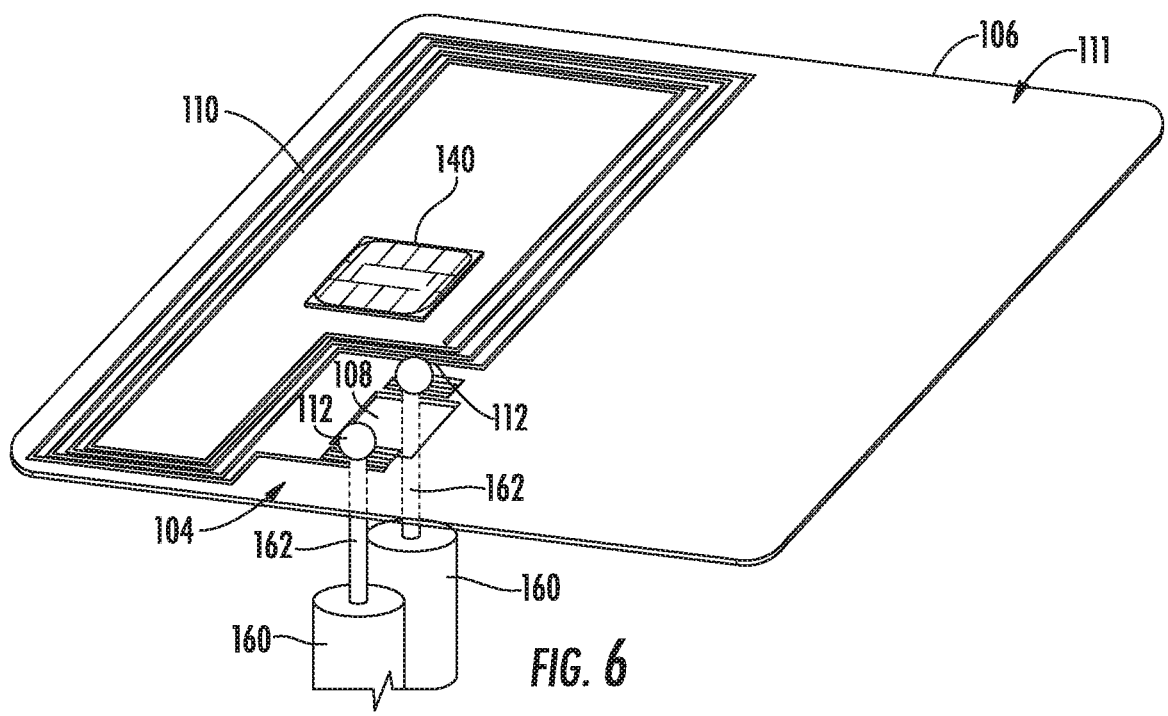
FIG. 6 is a top perspective view of the portions of the contactless card at the instance of FIG. 5, in accordance with embodiments of the present disclosure.

To illustrate this process, FIG. 5 presents a side exploded view of a contactless card illustrating one instance during fabrication of a contactless card, in accordance with embodiments of the present disclosure. FIG. 6 presents a top perspective view of the same operation as depicted in FIG. 5, with the card body 102 removed for clarity. In the operation depicted in FIGS. 5 and 6, a light source, such as a laser source 160, is arranged on the lower side 115 of the UV-transparent layer 109. In the example of FIG. 5, a laser source 160 is arranged to direct the laser beams 162 through the UV-transparent layer 109 to a pair of curable connectors 112, disposed on the first side 111 of the UV-transparent layer 109. According to different embodiments, the laser source 160 may include, for example, two laser beams, to simultaneously direct two different laser beams, each beam shown as a laser beam 162, to two different curable connectors. Thus, a first exposure, such as a first UV laser beam exposure may be directed to a first curable connector of the pair of curable connectors 112, while a second exposure, such as a second UV laser beam exposure may be directed to a second curable connector of the pair of curable connectors 112.

Alternatively, the laser source 160 may use just one laser to direct the laser beam 162 in a sequential manner through the UV-transparent layer 109 to a first of the curable connectors 112, and then to a second of the curable connectors 112. In accordance with various non-limiting embodiments, a wavelength of the radiation of the laser beam 162 may be in the ultraviolet range, such as below approximately 400 nm. The wavelength may be chosen to be suitable for a given material of the curable connectors 112. For example, some known epoxies may be suitable for curing using radiation in the range of 320 nm to 380 nm. Accordingly, the wavelength of laser beam 162 may be set in the range of 320 nm to 380 nm for examples where the curable connectors 112 are made from epoxy that is curable in this wavelength range. Of course for epoxies or other curable materials that are suitable for curing in a different wavelength range, the wavelength of laser beam 162 may be in the different range. In accordance with various non-limiting embodiments, the UV-transparent layer 109 may transmit more than 5%, than 10%, more than 20%, more than 50% percent of radiation from the side 115 to the first side 111, for UV radiation in the suitable range for curing the curable connectors 112, such as below 400 nm. Notably, the percent transmission of the UV-transparent layer 109 suitable for curing the curable connectors 112 will be dependent upon the epoxy material or other material used for curable connectors, and the sensitivity to the radiation. In some cases, a lower transmission may be compensated by increasing the amount of exposure time required for complete curing. Also, the power output of the laser beam 162 may be adjusted upwardly to adapt to lower percent transmission.

In addition, referring again to FIG. 4B, the serpentine pattern of the end regions 122, 124 may be arranged to provide a large fraction of exposed area of the curable connectors 112, meaning the area of second regions 138 ($A_{138}$). For example, the ratio of $A_{138}$ to the total area of the first regions 136 and second regions 138 ($A_{136+138}$), may be greater than 10%, greater than 20%, greater than 30%, greater than 50%, in some non-limiting embodiments. Again, the power or duration of exposure to laser beam 162 may be adjusted according to the percent transmission of UV-transparent layer 109 as well as the ratio of $A_{138}$/($A_{136+138}$). Accordingly, the curable connectors may be exposed for a duration of 0.1 to seconds to many seconds to cause the curable connectors to cure. Notably, curing time may vary with energy intensity and exact material of the curable connectors. For example, curing using a mercury vapor lamp source having energy density in the range of 200 watt/inch may cure the curable connectors in a time frame of seconds to one minute, when positioned approximately 6-10 inches from the curable connectors. Curing user a laser source affords higher energy density and may therefore effect curing in a matter of tenths of seconds to a few seconds, for example.

In embodiments of a conductive adhesive material, such as conductive epoxy, the exposure to the laser beams 162 may result in rapid curing of the curable connectors 112, forming a solid bond between the antenna 110 and the contactless chip module 140, through the curable connectors 112. UV exposure accordingly triggers a polymerization (curing) reaction, promoting adhesion of the contactless chip module 140 with the antenna assembly layer 106.

Because the curable connectors are electrically conductive, an electrically conductive path is thus established between the antenna 110 and contactless chip module 140. The exposure to the laser beams 162 may be of sufficiently short duration, wherein the curable connectors 112 do not unduly deform, or spread out, so the curable connectors 112 do not touch the edges 114 of the window 104 defined by the card body 102.

Referring again to FIGS. 1-3, according to some embodiments, the recess 108 may accommodate a portion of the curable connectors 112 during the process to join the contactless chip modules 140 to the antenna 110. Because the recess 108 is below the main surface of the UV transparent layer on the first side 111, the curable connectors 112, under pressure, may tend to deform so as to flow into the recess 108, rather than toward the edge 114.

Figure 7:
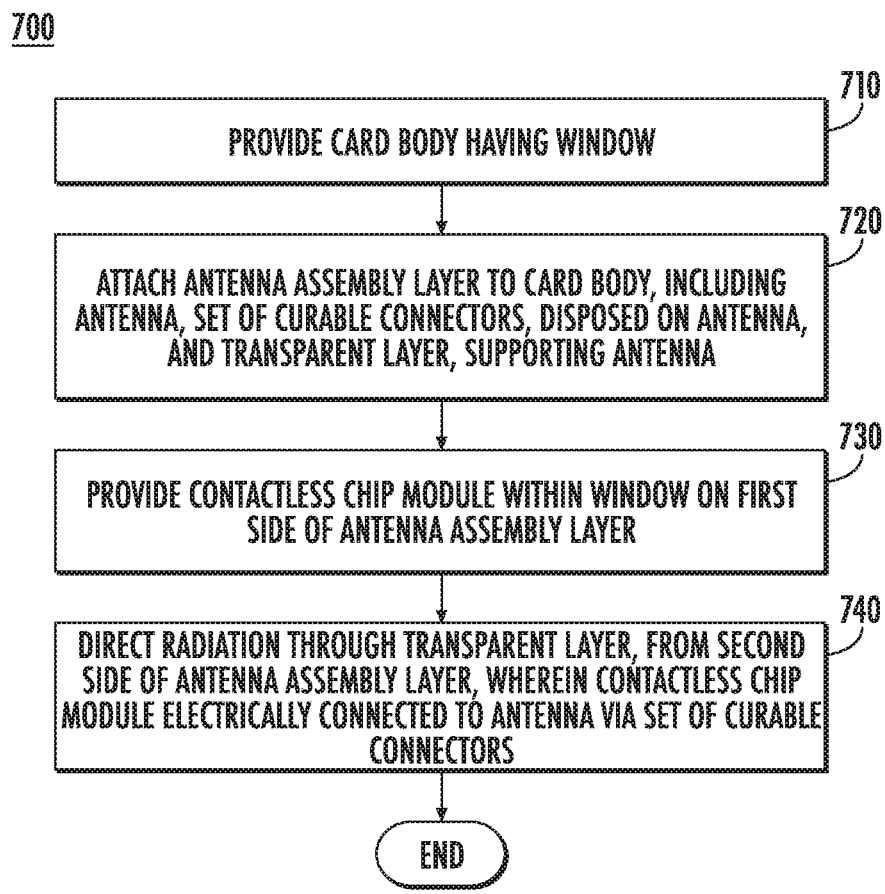
FIG. 7 illustrates a flowchart for performing methods in accordance with embodiments of the present disclosure.

FIG. 7 illustrates a flowchart 700 for performing methods in accordance with embodiments of the present disclosure. At block 710, a card body of a transaction card is provided, where the card body of includes a window. In some embodiments, the card body may be formed of a metallic material, while the window extends through the card body.

At block 720 an antenna assembly layer is attached to the card body. The antenna assembly layer may include a thin transparent layer, such as a UV transparent layer, where the transparent layer supports an antenna on a first side of the transparent layer. The antenna assembly layer may further include a set of curable connectors that are disposed over end regions of the antenna. In various embodiments, the set of curable connectors may be two curable connectors that are electrically conductive and are placed over the opposing end regions of the antenna in an uncured state. Suitable material for the set of curable connectors includes a conductive epoxy, or other conductive composite.

At block 730, a contactless chip module is provided within the window on the first side of the antenna assembly layer. In various embodiments, the curable connectors may extend above the antenna. As such, the contactless chip module may be brought into direct contact with the set of curable connectors. The contactless chip module may include two electrical contacts, for example, that are brought into contact with two respective curable connectors.

At block 740, when the contactless chip module is disposed in the window, radiation is directed through the transparent layer, from a second side of the antenna assembly layer, opposite the first side. The radiation may constitute UV radiation that cures the curable connectors, and facilitates adhesion between the curable connectors and the contactless chip module. In particular embodiments, the radiation may be directed as one or more laser beams characterized by an electromagnetic wavelength in the ultraviolet range, that impinges upon each curable connector of the set of curable connectors. At least a portion of the curable connectors may be directly disposed over the UV transparent layer, while another portion is disposed over end regions of the antenna. As such, the curable connectors may be sufficiently exposed to the radiation to cause rapid curing, wherein the contactless chip module becomes electrically connected to the antenna via the set of curable connectors.

Figure 8:
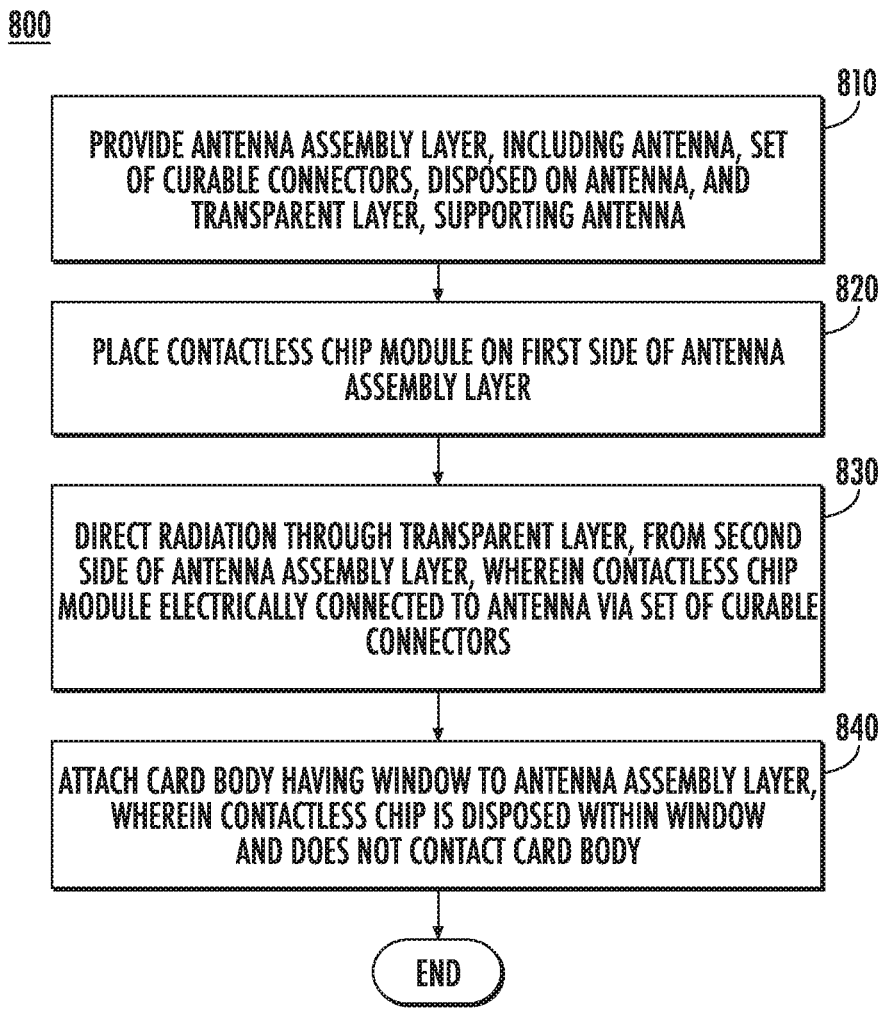
FIG. 8 illustrates another flowchart for performing methods in accordance with embodiments of the present disclosure.

FIG. 8 illustrates another flowchart 800 for performing methods in accordance with other embodiments of the present disclosure.

At block 810, an antenna assembly layer is provided, including an antenna, a set of curable connectors, disposed on the antenna, and a transparent layer, supporting the antenna. In various embodiments, the set of curable connectors may be two curable connectors that are electrically conductive and are placed over the opposing end regions of the antenna in an uncured state. Suitable material for the set of curable connectors includes a conductive epoxy, or other conductive composite.

At block 820, a contactless chip module is placed on a first side of the antenna assembly layer. The set of curable connectors may extend above the surface of the antenna, so that the contactless chip module is brought into direct contact with the set of curable connectors. The contactless chip module may include two electrical contacts, for example, that are brought into contact with two respective curable connectors.

At block 830, radiation is directed through the transparent layer, from a second side of the antenna assembly layer, wherein the contactless chip module is electrically connected to the antenna via the set of curable connectors. The radiation may constitute UV radiation that cures the curable connectors, and facilitates adhesion between the curable connectors and the contactless chip module. In particular embodiments, the radiation may be directed as one or more laser beams characterized by an electromagnetic wavelength in the ultraviolet range, that impinges upon each curable connector of the set of curable connectors. As such, the curable connectors may experience rapid curing, wherein the contactless chip module becomes electrically connected to the antenna via the set of curable connectors.

At block 840 a card body having a window is attached to the antenna assembly layer, in a manner wherein the contactless chip is disposed within the window and does not contact the card body. In other words, the card body may be placed in alignment with the antenna assembly layer in a manner that positions the window around the contactless chip.

Figure 9:
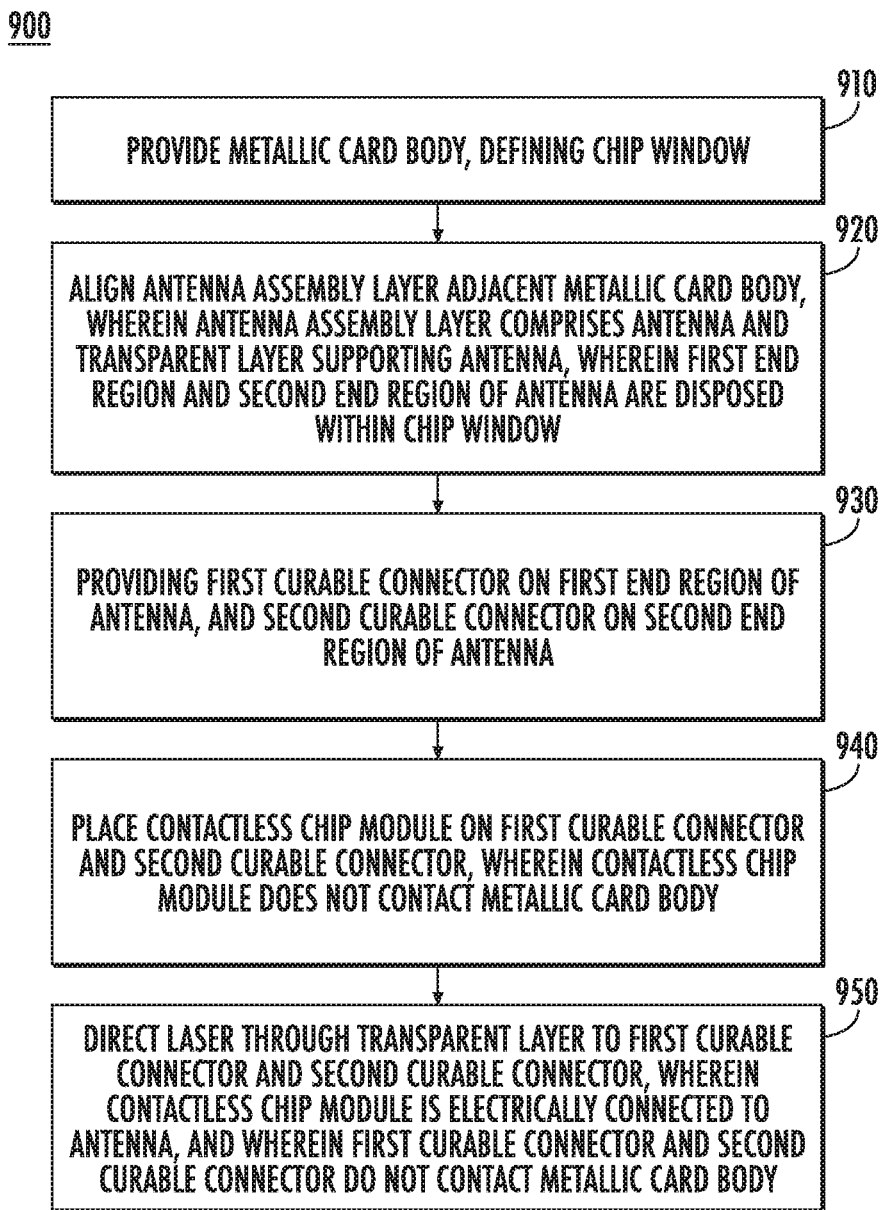
FIG. 9 illustrates another flowchart for performing methods in accordance with embodiments of the present disclosure.

FIG. 9 illustrates another flowchart 900 for performing methods in accordance with embodiments of the present disclosure. At block 910, a metallic card body is provided, where the metallic card body defines a chip window. The chip window may extend entirely through the metallic card body.

At block 920 an antenna assembly layer is aligned adjacent to the metallic card body, wherein the antenna assembly layer includes an antenna and transparent layer supporting the antenna. The antenna may include a first end region and second end region, such that the aligning of the antenna assembly layer places the first end region and the second end region within the chip window. In some embodiments, the antenna assembly layer may be joined to the card body at this stage.

At block 930 a first curable connector is provided on the first end region of the antenna, and a second curable connector is provided on the second end region of the antenna. The placement of the first curable connector and second curable connector on the first end region and the second end region, respectively, may take place when the first end region and second end region are located within the window of the card body. The first curable connector and the second curable connector may be electrically conductive such as a conductive epoxy, or other conductive composite.

At block 940 a contactless chip module is provided on the first curable connector and the second curable connector, in a manner wherein the contactless chip module does not contact the metallic card body. The contactless chip module may include a semiconductor chip, and two electrical contacts, for example, that are brought into contact with the first curable connector and the second curable connector when the contactless chip module is placed in the window of the metallic card body.

At block 950, a laser (beam) is directed through the transparent layer to the first curable connector and the second curable connector, so as to cure the first curable connector and the second curable connector. In some examples, the transparent layer may be a UV transparent layer, and the laser may be formed of radiation having a wavelength in the UV range. In some non-limiting embodiments, the laser may expose the first curable connector and the second curable connector for a duration of between 0.1 second and several seconds. As such, the contactless chip module may be electrically connected to the antenna, in a manner wherein the first curable connector and the second curable connector do not contact the metallic card body.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. However, it should be understood that various features of the certain aspects, embodiments, or configurations of the disclosure may be combined in alternate aspects, embodiments, or configurations. Moreover, the following claims are hereby incorporated into this Detailed Description by this reference, with each claim standing on its own as a separate embodiment of the present disclosure.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are just used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Furthermore, identification references (e.g., primary, secondary, first, second, third, fourth, etc.) are not intended to connote importance or priority, but are used to distinguish one feature from another. The drawings are for purposes of illustration and the dimensions, positions, order and relative sizes reflected in the drawings attached hereto may vary. Although non-limiting, the contactless card 150 and the contactless card 150 described herein may have standardized dimensions. For example, ISO/IEC 7816 is an international standard related to electronic identification cards with contacts, especially smart cards, managed jointly by the International Organization for Standardization (ISO) and the International Electrotechnical Commission (IEC). There are other standards, however, such as ISO/IEC 14443 for contactless cards (PayPass, PayWave, ExpressPay). A further standard ISO/IEC 7810 ID-1, with which most credit cards are compliant, defines dimensions as 85.60×53.98 mm (3.370×2.125 in) and a thickness of 0.76 mm (0.030 in).

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, although the above illustrative methods are described above as a series of acts or events, the present disclosure is not limited by the illustrated ordering of such acts or events unless specifically stated. For example, some acts may occur in different orders and/or concurrently with other acts or events apart from those illustrated and/or described herein, in accordance with the disclosure. In addition, not all illustrated acts or events may be required to implement a methodology in accordance with the present disclosure. Furthermore, the methods may be implemented in association with the formation and/or processing of structures illustrated and described herein as well as in association with other structures not illustrated.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of forming a contactless transaction card, comprising:
   providing a card body, the card body defining a window;
   attaching an antenna assembly layer to the card body, the antenna assembly layer comprising an antenna, a set of curable connectors, the set of curable connectors comprising a chemical or set of chemicals that are amenable to curing when exposed to radiation, the set of curable connectors being disposed on a set of end regions of the antenna within the window, and a UV-transparent layer, supporting the antenna;
   providing a contactless chip module within the window on a first side of the antenna assembly layer; and
   directing radiation through the UV-transparent layer, wherein the radiation cures the set of curable connectors, and wherein the contactless chip module is electrically connected to the antenna via the set of curable connectors.

2. The method of claim 1, wherein the directing the radiation through the UV-transparent layer comprises:
   directing a first UV laser beam exposure to a first curable connector, disposed on a first end region of the antenna; and directing a second UV laser beam exposure to a second curable connector, disposed on a second end region of the antenna.

3. The method of claim 1, wherein the set of curable connectors comprises a conductive epoxy material.

4. The method of claim 1, wherein the card body is electrically conductive, wherein an outer portion of the antenna extends subjacent the card body, the method further comprising providing an insulator material between the outer portion of the antenna and the card body before the attaching the antenna assembly layer.

5. The method of claim 1, wherein the set of curable connectors extends partially over the set of end regions of the antenna, and partially over exposed regions of the UV-transparent layer, not covered by the antenna.

6. The method of claim 1, wherein the set of end regions of the antenna comprise a serpentine pattern.

7. The method of claim 1, wherein the UV-transparent layer defines a recess, wherein the window comprises a first area, the recess comprises a second area, smaller than the first area, the method further comprising aligning the window to the recess.

8. The method of claim 7, wherein the set of end regions comprises a first end region and a second end region, wherein the recess is disposed between the first end region and the second end region.

9. The method of claim 8, wherein the set of curable connectors comprises a first connector, disposed on the first end region of the antenna, and a second connector, disposed on the second end region of the antenna, wherein the aligning the window comprises aligning the window to avoid contact with the set of curable connectors.

10. A contactless transaction card, comprising:
    a card body, the card body defining a window;
    an antenna assembly layer, disposed subjacent the card body, the antenna assembly layer comprising:
      an antenna, comprising a set of end regions;
      a UV-transparent layer, supporting the antenna; and
      a set of curable connectors, disposed on the set of end regions, and comprising a chemical or set of chemicals that are amenable to curing when exposed to UV radiation,
      the set of end regions, and set of curable connectors being disposed within the window; and
    a contactless chip module, disposed within the window, and electrically connected to the set of end regions, via the set of curable connectors.

11. The contactless transaction card of claim 10, the set of curable connectors and the contactless chip module not being in contact with the card body.

12. The contactless transaction card of claim 10, wherein the set of curable connectors comprises a conductive epoxy material.

13. The contactless transaction card of claim 10, wherein the card body is electrically conductive, wherein an outer portion of the antenna extends subjacent the card body, the contactless transaction card further comprising an insulator material, disposed between the outer portion of the antenna and the card body.

14. The contactless transaction card of claim 10, wherein the set of curable connectors extends partially over the set of end regions of the antenna, and partially over exposed regions of the UV-transparent layer, not covered by the antenna.

15. The contactless transaction card of claim 10, wherein the set of end regions of the antenna comprise a serpentine pattern.

16. The contactless transaction card of claim 10, wherein the UV-transparent layer defines a recess, wherein the window comprises a first area, the recess comprises a second area, smaller than the first area, wherein the recess is aligned within the window.

17. The contactless transaction card of claim 16, wherein the set of end regions comprises a first end region and a second end region, wherein the recess is disposed between the first end region and the second end region.

18. A method of forming a contactless transaction card, comprising:
    providing a card body, the card body defining window;
    coupling an antenna assembly layer to the card body, the antenna assembly layer comprising an antenna, and a transparent layer, supporting the antenna;
    providing a first curable connector on a first end region of the antenna, and a second curable connector on a second end region of the antenna, wherein the first end region, the second end region, the first curable connector and the second curable connector are disposed in the window, the first curable connector and the second curable connector comprising a chemical or set of chemicals that are amenable to curing when exposed to radiation;

providing a contactless chip module within the window on a first side of the transparent layer; and directing radiation through the transparent layer from a second side of the transparent layer, opposite the first side, wherein the radiation cures the first curable connector and the second curable connector, and wherein the contactless chip module is electrically connected to the antenna via the first curable connector and the second curable connector.

19. The method of claim 18, wherein the directing the radiation through the transparent layer comprises:

directing a UV laser beam exposure to the first curable connector; and directing a second UV laser beam exposure to the second curable connector.

20. The method of claim 18, wherein the first curable connector extends partially over the first end region of the antenna, and partially over a first exposed region of the transparent layer, not covered by the antenna, and wherein the second curable connector extends partially over the second end region of the antenna, and partially a second exposed region of the transparent layer, not covered by the antenna.

* * * * *